(12) United States Patent
Romero

(10) Patent No.: US 11,262,422 B2
(45) Date of Patent: Mar. 1, 2022

(54) STRAY-FIELD-IMMUNE COIL-ACTIVATED POSITION SENSOR

(71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

(*) Notice: Subject to any disclaimer, the term of this patent is extended or adjusted under 35 U.S.C. 154(b) by 14 days.

(21) Appl. No.: 16/870,265

(22) Filed: May 8, 2020

(65) Prior Publication Data

US 2021/0349163 A1  Nov. 11, 2021

(51) Int. Cl.
*G01R 33/09* (2006.01)
*G01D 5/16* (2006.01)

(52) U.S. Cl.
CPC .............. *G01R 33/09* (2013.01); *G01D 5/16* (2013.01)

(58) Field of Classification Search
CPC ........... G01R 33/09; G01D 21/02; G01D 5/16
See application file for complete search history.

(56) References Cited

U.S. PATENT DOCUMENTS

| | | | |
|---|---|---|---|
| 3,132,337 A | 5/1964 | Martin | |
| 3,195,043 A | 7/1965 | Burig et al. | |
| 3,281,628 A | 10/1966 | Bauer et al. | |
| 3,607,528 A | 9/1971 | Gassaway | |
| 3,611,138 A | 10/1971 | Winebrener | |
| 3,661,061 A | 5/1972 | Tokarz | |
| 3,728,786 A | 4/1973 | Lucas et al. | |
| 4,048,670 A | 9/1977 | Eysermans | |
| 4,180,753 A | 12/1979 | Cook, II | |
| 4,188,605 A | 2/1980 | Stout | |
| 4,204,317 A | 5/1980 | Winn | |
| 4,236,832 A | 12/1980 | Komatsu et al. | |
| 4,283,643 A | 8/1981 | Levin | |
| 4,315,523 A | 2/1982 | Mahawili et al. | |
| 4,438,347 A | 3/1984 | Gehring | |
| 4,573,258 A | 3/1986 | Io et al. | |

(Continued)

FOREIGN PATENT DOCUMENTS

| | | |
|---|---|---|
| CN | 683469 A5 | 3/1994 |
| CN | 10232554 A | 1/2012 |

(Continued)

OTHER PUBLICATIONS

U.S. Appl. No. 15/837,511, filed Dec. 11, 2017, Lassalle-Balier et al.

(Continued)

*Primary Examiner* — Alvaro E Fortich
(74) *Attorney, Agent, or Firm* — Daly, Crowley, Mofford & Durkee, LLP

(57) ABSTRACT

A sensor comprising: a first magnetoresistive (MR) bridge having a first stray field sensitivity; a second MR bridge having a second stray field sensitivity; and a driver circuitry configured to: (i) supply a first voltage to the first MR bridge, and (ii) supply a second voltage to the second MR bridge that is different from the first voltage, wherein supplying the first voltage and the second voltage to the first MR bridge and the second MR bridge, respectively, causes the first stray field sensitivity to match the second stray field sensitivity.

20 Claims, 7 Drawing Sheets

(56) References Cited

U.S. PATENT DOCUMENTS

| | | |
|---|---|---|
| 4,614,111 A | 9/1986 | Wolff |
| 4,649,796 A | 3/1987 | Schmidt |
| 4,670,715 A | 6/1987 | Fuzzell |
| 4,703,378 A | 10/1987 | Imakoshi et al. |
| 4,719,419 A | 1/1988 | Dawley |
| 4,733,455 A | 3/1988 | Nakamura et al. |
| 4,745,363 A | 5/1988 | Carr et al. |
| 4,746,859 A | 5/1988 | Malik |
| 4,752,733 A | 6/1988 | Petr et al. |
| 4,758,943 A | 7/1988 | Astrbm et al. |
| 4,760,285 A | 7/1988 | Nelson |
| 4,764,767 A | 8/1988 | Ichikawa et al. |
| 4,769,344 A | 9/1988 | Sakai et al. |
| 4,772,929 A | 9/1988 | Manchester |
| 4,789,826 A | 12/1988 | Willett |
| 4,796,354 A | 1/1989 | Yokoyama et al. |
| 4,823,075 A | 4/1989 | Alley |
| 4,833,406 A | 5/1989 | Foster |
| 4,893,027 A | 1/1990 | Kammerer et al. |
| 4,908,685 A | 3/1990 | Shibasaki et al. |
| 4,910,861 A | 3/1990 | Dohogne |
| 4,935,698 A | 6/1990 | Kawaji et al. |
| 4,944,028 A | 7/1990 | Iijima et al. |
| 4,954,777 A | 9/1990 | Klopfer et al. |
| 4,970,411 A | 11/1990 | Haig et al. |
| 4,983,916 A | 1/1991 | Iijima et al. |
| 4,991,447 A | 2/1991 | Yahagi et al. |
| 5,012,322 A | 4/1991 | Guillotte et al. |
| 5,021,493 A | 6/1991 | Sandstrom |
| 5,028,868 A | 7/1991 | Murata et al. |
| 5,045,920 A | 9/1991 | Vig et al. |
| 5,078,944 A | 1/1992 | Yoshino |
| 5,084,289 A | 1/1992 | Shin et al. |
| 5,121,289 A | 6/1992 | Gagliardi |
| 5,137,677 A | 8/1992 | Murata |
| 5,139,973 A | 8/1992 | Nagy et al. |
| 5,167,896 A | 12/1992 | Hirota et al. |
| 5,185,919 A | 2/1993 | Hickey |
| 5,196,794 A | 3/1993 | Murata |
| 5,200,698 A | 4/1993 | Thibaud |
| 5,210,493 A | 5/1993 | Schroeder et al. |
| 5,216,405 A | 6/1993 | Schroeder et al. |
| 5,244,834 A | 9/1993 | Suzuki et al. |
| 5,247,202 A | 9/1993 | Popovic et al. |
| 5,247,278 A | 9/1993 | Pant et al. |
| 5,250,925 A | 10/1993 | Shinkle |
| 5,286,426 A | 2/1994 | Rano, Jr. et al. |
| 5,289,344 A | 2/1994 | Gagnon et al. |
| 5,315,245 A | 5/1994 | Schroeder et al. |
| 5,329,416 A | 7/1994 | Ushiyama et al. |
| 5,332,956 A | 7/1994 | Oh |
| 5,332,965 A | 7/1994 | Wolf et al. |
| 5,351,028 A | 9/1994 | Krahn |
| 5,399,968 A | 3/1995 | Sheppard et al. |
| 5,412,255 A | 5/1995 | Wallrafen |
| 5,414,355 A | 5/1995 | Davidson et al. |
| 5,424,558 A | 6/1995 | Borden et al. |
| 5,432,444 A | 7/1995 | Yasohama et al. |
| 5,434,105 A | 7/1995 | Liou |
| 5,453,727 A | 9/1995 | Shibasaki et al. |
| 5,469,058 A | 11/1995 | Dunnam |
| 5,479,695 A | 1/1996 | Grader et al. |
| 5,486,759 A | 1/1996 | Seiler et al. |
| 5,488,294 A | 1/1996 | Liddell et al. |
| 5,491,633 A | 2/1996 | Henry et al. |
| 5,497,081 A | 3/1996 | Wolf et al. |
| 5,500,589 A | 3/1996 | Sumcad |
| 5,500,994 A | 3/1996 | Itaya |
| 5,508,611 A | 4/1996 | Schroeder et al. |
| 5,514,953 A | 5/1996 | Schultz et al. |
| 5,521,501 A | 5/1996 | Dettmann et al. |
| 5,545,983 A | 8/1996 | Okeya et al. |
| 5,551,146 A | 9/1996 | Kawabata et al. |
| 5,581,170 A | 12/1996 | Mammano et al. |
| 5,581,179 A | 12/1996 | Engel et al. |
| 5,596,272 A | 1/1997 | Busch |
| 5,621,319 A | 4/1997 | Bilotti et al. |
| 5,627,315 A | 5/1997 | Figi et al. |
| 5,631,557 A | 5/1997 | Davidson |
| 5,640,090 A | 6/1997 | Furuya et al. |
| 5,691,637 A | 11/1997 | Oswald et al. |
| 5,696,790 A | 12/1997 | Graham et al. |
| 5,712,562 A | 1/1998 | Berg |
| 5,714,102 A | 2/1998 | Highum et al. |
| 5,719,496 A | 2/1998 | Wolf |
| 5,729,128 A | 3/1998 | Bunyer et al. |
| 5,757,181 A | 5/1998 | Wolf et al. |
| 5,781,005 A | 7/1998 | Vig et al. |
| 5,789,658 A | 8/1998 | Henn et al. |
| 5,789,915 A | 8/1998 | Ingraham |
| 5,796,249 A | 8/1998 | Andräet et al. |
| 5,798,462 A | 8/1998 | Briefer et al. |
| 5,818,222 A | 10/1998 | Ramsden |
| 5,818,223 A | 10/1998 | Wolf |
| 5,839,185 A | 11/1998 | Smith et al. |
| 5,841,276 A | 11/1998 | Makino et al. |
| 5,859,387 A | 1/1999 | Gagnon |
| 5,883,567 A | 3/1999 | Mullins, Jr. |
| 5,886,070 A | 3/1999 | Honkura et al. |
| 5,896,030 A | 4/1999 | Hasken |
| 5,912,556 A | 6/1999 | Frazee et al. |
| 5,963,028 A | 10/1999 | Engel et al. |
| 6,011,770 A | 1/2000 | Tan |
| 6,016,055 A | 1/2000 | Jager et al. |
| 6,032,536 A | 3/2000 | Peeters et al. |
| 6,043,644 A | 3/2000 | de Coulon et al. |
| 6,043,646 A | 3/2000 | Jansseune |
| 6,064,198 A | 5/2000 | Wolf et al. |
| 6,136,250 A | 10/2000 | Brown |
| 6,169,396 B1 | 1/2001 | Yokotani et al. |
| 6,175,232 B1 | 1/2001 | De Coulon et al. |
| 6,175,233 B1 | 1/2001 | McCurley et al. |
| 6,180,041 B1 | 1/2001 | Takizawa |
| 6,184,679 B1 | 2/2001 | Popovic et al. |
| 6,198,373 B1 | 3/2001 | Ogawa et al. |
| 6,242,604 B1 | 6/2001 | Hudlicky et al. |
| 6,242,904 B1 | 6/2001 | Shirai et al. |
| 6,242,905 B1 | 6/2001 | Draxelmayr |
| 6,265,865 B1 | 7/2001 | Engel et al. |
| 6,278,269 B1 | 8/2001 | Vig et al. |
| 6,297,627 B1 | 10/2001 | Towne et al. |
| 6,339,322 B1 | 1/2002 | Loreck et al. |
| 6,351,506 B1 | 2/2002 | Lewicki |
| 6,356,068 B1 | 3/2002 | Steiner et al. |
| 6,366,079 B1 | 4/2002 | Uenoyama |
| 6,392,478 B1 | 5/2002 | Mulder et al. |
| 6,429,640 B1 | 8/2002 | Daughton et al. |
| 6,436,748 B1 | 8/2002 | Forbes et al. |
| 6,437,558 B2 | 8/2002 | Li et al. |
| 6,452,381 B1 | 9/2002 | Nakatani et al. |
| 6,462,536 B1 | 10/2002 | Mednikov et al. |
| 6,492,804 B2 | 12/2002 | Tsuge et al. |
| 6,501,270 B1 | 12/2002 | Opie |
| 6,504,363 B1 | 1/2003 | Dogaru et al. |
| 6,525,531 B2 | 2/2003 | Forrest et al. |
| 6,528,992 B2 | 3/2003 | Shinjo et al. |
| 6,542,847 B1 | 4/2003 | Lohberg et al. |
| 6,545,332 B2 | 4/2003 | Huang |
| 6,545,457 B2 | 4/2003 | Goto et al. |
| 6,545,462 B2 | 4/2003 | Schott et al. |
| 6,566,862 B1 | 5/2003 | Goto et al. |
| 6,566,872 B1 | 5/2003 | Sugitani |
| 6,640,451 B1 | 11/2003 | Vinarcik |
| 6,653,968 B1 | 11/2003 | Schneider |
| 6,674,679 B1 | 1/2004 | Perner et al. |
| 6,687,644 B1 | 2/2004 | Zinke et al. |
| 6,692,676 B1 | 2/2004 | Vig et al. |
| 6,707,298 B2 | 3/2004 | Suzuki et al. |
| 6,759,843 B2 | 7/2004 | Furlong |
| 6,770,163 B1 | 8/2004 | Kuah et al. |
| 6,781,233 B2 | 8/2004 | Zverev et al. |
| 6,781,359 B2 | 8/2004 | Stauth et al. |
| 6,798,193 B2 | 9/2004 | Zimmerman et al. |
| 6,815,944 B2 | 11/2004 | Vig et al. |

(56) References Cited

U.S. PATENT DOCUMENTS

| | | |
|---|---|---|
| 6,822,443 B1 | 11/2004 | Dogaru |
| 6,853,178 B2 | 2/2005 | Hayat-Dawoodi |
| 6,896,407 B2 | 5/2005 | Nomiyama et al. |
| 6,902,951 B2 | 6/2005 | Goller et al. |
| 6,917,321 B1 | 7/2005 | Haurie et al. |
| 6,956,366 B2 | 10/2005 | Butzmann |
| 6,989,921 B2 | 1/2006 | Bernstein et al. |
| 7,023,205 B1 | 4/2006 | Krupp |
| 7,026,808 B2 | 4/2006 | Vig et al. |
| 7,031,170 B2 | 4/2006 | Daeche et al. |
| 7,038,448 B2 | 5/2006 | Schott et al. |
| 7,049,924 B2 | 5/2006 | Hayashi et al. |
| 7,112,955 B2 | 9/2006 | Buchhold |
| 7,112,957 B2 | 9/2006 | Bicking |
| 7,126,327 B1 | 10/2006 | Busch |
| 7,132,825 B2 | 11/2006 | Martin |
| 7,190,784 B2 | 3/2007 | Li |
| 7,193,412 B2 | 3/2007 | Freeman |
| 7,199,579 B2 | 4/2007 | Scheller et al. |
| 7,259,545 B2 | 8/2007 | Stauth et al. |
| 7,265,531 B2 | 9/2007 | Stauth et al. |
| 7,269,992 B2 | 9/2007 | Lamb et al. |
| 7,285,952 B1 | 10/2007 | Hatanaka et al. |
| 7,292,095 B2 | 11/2007 | Burt et al. |
| 7,295,000 B2 | 11/2007 | Werth |
| 7,319,319 B2 | 1/2008 | Jones et al. |
| 7,323,780 B2 | 1/2008 | Daubenspeck et al. |
| 7,323,870 B2 | 1/2008 | Tatschl et al. |
| 7,325,175 B2 | 1/2008 | Momtaz |
| 7,345,468 B2 | 3/2008 | Okada et al. |
| 7,355,388 B2 | 4/2008 | Ishio |
| 7,361,531 B2 | 4/2008 | Sharma et al. |
| 7,362,094 B2 | 4/2008 | Voisine et al. |
| 7,365,530 B2 | 4/2008 | Bailey et al. |
| 7,385,394 B2 | 6/2008 | Auburger et al. |
| 7,425,821 B2 | 9/2008 | Monreal et al. |
| 7,474,093 B2 | 1/2009 | Ausserlechner |
| 7,476,953 B2 | 1/2009 | Taylor et al. |
| 7,518,354 B2 | 4/2009 | Stauth et al. |
| 7,592,801 B2 | 9/2009 | Bailey et al. |
| 7,598,601 B2 | 10/2009 | Taylor et al. |
| 7,605,647 B1 | 10/2009 | Romero et al. |
| 7,635,993 B2 | 12/2009 | Boeve |
| 7,694,200 B2 | 4/2010 | Forrest et al. |
| 7,701,208 B2 | 4/2010 | Nishikawa |
| 7,705,586 B2 | 4/2010 | van Zon et al. |
| 7,729,675 B2 | 6/2010 | Krone |
| 7,746,056 B2 | 6/2010 | Stauth et al. |
| 7,746,065 B2 | 6/2010 | Pastre et al. |
| 7,764,118 B2 | 7/2010 | Kusuda et al. |
| 7,768,083 B2 | 8/2010 | Doogue et al. |
| 7,769,110 B2 | 8/2010 | Momtaz |
| 7,777,607 B2 | 8/2010 | Taylor et al. |
| 7,795,862 B2 | 9/2010 | Doogue et al. |
| 7,800,389 B2 | 9/2010 | Friedrich et al. |
| 7,808,074 B2 | 10/2010 | Knittl |
| 7,816,772 B2 | 10/2010 | Engel et al. |
| 7,816,905 B2 | 10/2010 | Doogue et al. |
| 7,839,141 B2 | 11/2010 | Werth et al. |
| 7,859,255 B2 | 12/2010 | Doogue et al. |
| 7,923,996 B2 | 4/2011 | Doogue et al. |
| 7,936,144 B2 | 5/2011 | Vig et al. |
| 7,956,604 B2 | 6/2011 | Ausserlechner |
| 7,961,823 B2 | 6/2011 | Kolze et al. |
| 7,982,454 B2 | 7/2011 | Fernandez et al. |
| 7,990,209 B2 | 8/2011 | Romero |
| 8,030,918 B2 | 10/2011 | Doogue et al. |
| 8,058,870 B2 | 11/2011 | Sterling |
| 8,063,631 B2 | 11/2011 | Fermon et al. |
| 8,063,634 B2 | 11/2011 | Sauber et al. |
| 8,080,993 B2 | 12/2011 | Theuss et al. |
| 8,106,649 B2 | 1/2012 | Kaita et al. |
| 8,106,654 B2 | 1/2012 | Theuss et al. |
| 8,128,549 B2 | 3/2012 | Testani et al. |
| 8,134,358 B2 | 3/2012 | Charlier et al. |
| 8,143,169 B2 | 3/2012 | Engel et al. |
| 8,253,210 B2 | 8/2012 | Theuss et al. |
| 8,274,279 B2 | 9/2012 | Gies |
| 8,299,783 B2 | 10/2012 | Fernandez et al. |
| 8,362,579 B2 | 1/2013 | Theuss et al. |
| 8,447,556 B2 | 5/2013 | Friedrich et al. |
| 8,461,677 B2 | 6/2013 | Ararao et al. |
| 8,486,755 B2 | 7/2013 | Ararao et al. |
| 8,542,010 B2 | 9/2013 | Cesaretti et al. |
| 8,559,139 B2 | 10/2013 | Theuss |
| 8,577,634 B2 | 11/2013 | Donovan et al. |
| 8,610,430 B2 | 12/2013 | Werth et al. |
| 8,624,588 B2 | 1/2014 | Vig et al. |
| 8,629,520 B2 | 1/2014 | Doogue et al. |
| 8,629,539 B2 | 1/2014 | Milano et al. |
| 8,680,846 B2 | 3/2014 | Cesaretti et al. |
| 8,680,848 B2 | 3/2014 | Foletto et al. |
| 8,692,546 B2 | 4/2014 | Cesaretti et al. |
| 8,754,640 B2 | 6/2014 | Vig et al. |
| 8,773,124 B2 | 7/2014 | Ausserlechner |
| 9,024,622 B2 | 5/2015 | Hohe et al. |
| 9,081,041 B2 | 7/2015 | Friedrich et al. |
| 9,116,018 B2 | 8/2015 | Frachon |
| 9,164,156 B2 | 10/2015 | Elian et al. |
| 9,201,122 B2 | 12/2015 | Cesaeretti et al. |
| 9,201,123 B2 | 12/2015 | Elian et al. |
| 9,228,860 B2 | 1/2016 | Sharma et al. |
| 9,411,025 B2 | 8/2016 | David et al. |
| 9,664,494 B2 | 5/2017 | Fernandez et al. |
| 10,114,085 B2 | 10/2018 | Eagen et al. |
| 10,145,908 B2 | 12/2018 | David et al. |
| 10,330,745 B2 | 6/2019 | Eagen et al. |
| 10,605,874 B2 | 3/2020 | Lassalle-Balier et al. |
| 10,670,672 B2 | 6/2020 | David et al. |
| 2001/0002791 A1 | 6/2001 | Tsuge et al. |
| 2001/0009367 A1 | 7/2001 | Seitzer et al. |
| 2001/0026153 A1 | 10/2001 | Nakamura et al. |
| 2002/0008513 A1 | 1/2002 | Hiligsmann et al. |
| 2002/0027488 A1 | 3/2002 | Hayat-Dawoodi et al. |
| 2002/0084923 A1 | 7/2002 | Li |
| 2002/0097639 A1 | 7/2002 | Ishizaki et al. |
| 2003/0001563 A1 | 1/2003 | Turner |
| 2003/0038675 A1 | 2/2003 | Gailus et al. |
| 2003/0062891 A1 | 4/2003 | Slates |
| 2003/0102909 A1 | 6/2003 | Motz |
| 2003/0222642 A1 | 12/2003 | Butzmann |
| 2003/0227286 A1 | 12/2003 | Dunisch et al. |
| 2004/0032251 A1 | 2/2004 | Zimmerman et al. |
| 2004/0046248 A1 | 3/2004 | Waelti et al. |
| 2004/0062362 A1 | 4/2004 | Matsuya |
| 2004/0080314 A1 | 4/2004 | Tsujii et al. |
| 2004/0135220 A1 | 7/2004 | Goto |
| 2004/0174164 A1 | 9/2004 | Ao |
| 2004/0184196 A1 | 9/2004 | Jayasekara |
| 2004/0189285 A1 | 9/2004 | Uenoyama |
| 2004/0196045 A1 | 10/2004 | Larsen |
| 2004/0263014 A1 | 12/2004 | Miya |
| 2005/0017709 A1 | 1/2005 | Stolfus et al. |
| 2005/0120782 A1 | 6/2005 | Kishibata et al. |
| 2005/0122095 A1 | 6/2005 | Dooley |
| 2005/0122099 A1 | 6/2005 | Imamoto et al. |
| 2005/0140355 A1 | 6/2005 | Yamada et al. |
| 2005/0167790 A1 | 8/2005 | Khor et al. |
| 2005/0179429 A1 | 8/2005 | Lohberg |
| 2005/0225318 A1 | 10/2005 | Bailey et al. |
| 2005/0280411 A1 | 12/2005 | Bicking |
| 2006/0033487 A1 | 2/2006 | Nagano et al. |
| 2006/0038559 A1 | 2/2006 | Lamb et al. |
| 2006/0038561 A1 | 2/2006 | Honkura et al. |
| 2006/0068237 A1 | 3/2006 | Murphy et al. |
| 2006/0097717 A1 | 5/2006 | Tokuhara et al. |
| 2006/0125473 A1 | 6/2006 | Frachon et al. |
| 2006/0181263 A1 | 8/2006 | Doogue et al. |
| 2006/0202692 A1 | 9/2006 | Tatschl et al. |
| 2006/0261801 A1 | 11/2006 | Busch |
| 2007/0110199 A1 | 5/2007 | Momtaz et al. |
| 2007/0170533 A1 | 7/2007 | Doogue et al. |
| 2007/0247135 A1 | 10/2007 | Koga |
| 2007/0247141 A1 | 10/2007 | Pastre et al. |

(56) References Cited

U.S. PATENT DOCUMENTS

| | | |
|---|---|---|
| 2007/0285089 A1 | 12/2007 | Ibuki et al. |
| 2008/0013298 A1 | 1/2008 | Sharma et al. |
| 2008/0137784 A1 | 6/2008 | Krone |
| 2008/0211492 A1 | 9/2008 | Tsukada et al. |
| 2008/0237818 A1 | 10/2008 | Engel et al. |
| 2008/0238410 A1 | 10/2008 | Charlier et al. |
| 2008/0258722 A1 | 10/2008 | Zon et al. |
| 2008/0270067 A1 | 10/2008 | Eriksen et al. |
| 2009/0001964 A1 | 1/2009 | Strzalkowski |
| 2009/0009163 A1 | 1/2009 | Yamada |
| 2009/0058404 A1 | 3/2009 | Kurumado |
| 2009/0085706 A1 | 4/2009 | Baarman et al. |
| 2009/0102467 A1 | 4/2009 | Snell et al. |
| 2009/0137398 A1 | 5/2009 | Bozovic et al. |
| 2009/0140724 A1 | 6/2009 | Kentsch |
| 2009/0140725 A1 | 6/2009 | Ausserlechner |
| 2009/0146647 A1 | 6/2009 | Ausserlechner |
| 2009/0152696 A1 | 6/2009 | Dimasacat et al. |
| 2009/0167298 A1 | 7/2009 | Kreutzbruck et al. |
| 2009/0167301 A1 | 7/2009 | Ausserlechner |
| 2009/0168286 A1 | 7/2009 | Berkley et al. |
| 2009/0206831 A1 | 8/2009 | Fermon et al. |
| 2009/0243601 A1 | 10/2009 | Feldtkeller |
| 2009/0251134 A1 | 10/2009 | Uenoyama |
| 2009/0256552 A1 | 10/2009 | Guo et al. |
| 2009/0315543 A1 | 12/2009 | Guo et al. |
| 2010/0033175 A1 | 2/2010 | Boeve et al. |
| 2010/0052667 A1 | 3/2010 | Kohama et al. |
| 2010/0053789 A1 | 3/2010 | Durie et al. |
| 2010/0072988 A1 | 3/2010 | Hammerschmidt et al. |
| 2010/0141249 A1 | 6/2010 | Ararao et al. |
| 2010/0188078 A1 | 7/2010 | Foletto et al. |
| 2010/0201356 A1 | 8/2010 | Koller et al. |
| 2010/0207620 A1 | 8/2010 | Gies |
| 2010/0276769 A1 | 11/2010 | Theuss et al. |
| 2010/0295140 A1 | 11/2010 | Theuss et al. |
| 2010/0330708 A1 | 12/2010 | Engel et al. |
| 2011/0004278 A1 | 1/2011 | Aghassian et al. |
| 2011/0018533 A1 | 1/2011 | Cesaretti et al. |
| 2011/0031960 A1 | 2/2011 | Hohe et al. |
| 2011/0050220 A1 | 3/2011 | Bootle et al. |
| 2011/0127998 A1 | 6/2011 | Elian et al. |
| 2011/0187354 A1 | 8/2011 | Zieren et al. |
| 2011/0224537 A1 | 9/2011 | Brunner |
| 2011/0248711 A1 | 10/2011 | Ausserlechner |
| 2011/0267040 A1 | 11/2011 | Frachon |
| 2011/0285384 A1 | 11/2011 | Nomura |
| 2012/0019236 A1 | 1/2012 | Tiernan et al. |
| 2012/0019239 A1 | 1/2012 | Decitre |
| 2012/0062215 A1 | 3/2012 | Ide et al. |
| 2012/0293167 A1 | 11/2012 | Kitanaka et al. |
| 2012/0303305 A1 | 11/2012 | Bergqvist et al. |
| 2013/0113474 A1 | 5/2013 | Elian |
| 2013/0147470 A1 | 6/2013 | Mulholland et al. |
| 2013/0207648 A1 | 8/2013 | Zibold et al. |
| 2013/0214777 A1 | 8/2013 | Itoi |
| 2013/0241543 A1 | 9/2013 | Stenson et al. |
| 2013/0249029 A1 | 9/2013 | Vig et al. |
| 2013/0249544 A1 | 9/2013 | Vig et al. |
| 2013/0278246 A1 | 10/2013 | Stegerer et al. |
| 2013/0300401 A1 | 11/2013 | Krapf et al. |
| 2013/0300402 A1 | 11/2013 | Liu et al. |
| 2013/0300406 A1 | 11/2013 | Pepka et al. |
| 2014/0184214 A1 | 7/2014 | Shaffer et al. |
| 2014/0333295 A1 | 11/2014 | Fernandez et al. |
| 2015/0022187 A1 | 1/2015 | Taylor et al. |
| 2015/0022193 A1 | 1/2015 | Burdette et al. |
| 2015/0022197 A1 | 1/2015 | David et al. |
| 2015/0022198 A1 | 1/2015 | David et al. |
| 2015/0211895 A1 | 7/2015 | Reitsma et al. |
| 2015/0236869 A1 | 8/2015 | Vreeland et al. |
| 2015/0323612 A1 | 11/2015 | Latham |
| 2015/0346290 A1* | 12/2015 | Holm .................. G01R 33/09 324/202 |
| 2016/0061863 A1* | 3/2016 | Zhang ................. G01R 33/123 324/126 |
| 2016/0069662 A1 | 3/2016 | Mullenix et al. |
| 2016/0123771 A1 | 5/2016 | David et al. |
| 2016/0123774 A1 | 5/2016 | Foletto et al. |
| 2016/0139230 A1 | 5/2016 | Petrie et al. |
| 2016/0169983 A1 | 6/2016 | Chang et al. |
| 2017/0131366 A1 | 5/2017 | Motz et al. |
| 2018/0340990 A1* | 11/2018 | Latham ................ G01R 33/091 |
| 2018/0356474 A1* | 12/2018 | Hammerschmidt .... H01L 43/10 |

FOREIGN PATENT DOCUMENTS

| | | |
|---|---|---|
| CN | 102331587 A | 1/2012 |
| CN | 102483443 A | 5/2012 |
| CN | 102713654 A | 10/2012 |
| CN | 102954808 A | 3/2013 |
| CN | 105378500 A | 3/2016 |
| DE | 2518054 | 11/1976 |
| DE | 4031560 A | 4/1992 |
| DE | 19539458 A1 | 4/1997 |
| DE | 19634715 A1 | 3/1998 |
| DE | 19650935 A1 | 6/1998 |
| DE | 19838433 | 3/1999 |
| DE | 19851839 A1 | 11/1999 |
| DE | 19961504 A1 | 6/2001 |
| DE | 10314602 | 10/2004 |
| DE | 102007018238 A1 | 10/2008 |
| DE | 102010016584 | 11/2010 |
| DE | 102011102483 | 11/2012 |
| DE | 10210184 | 9/2013 |
| EP | 0146091 | 6/1985 |
| EP | 0289414 A2 | 11/1988 |
| EP | 0289414 A3 | 11/1988 |
| EP | 0357013 A2 | 3/1990 |
| EP | 0357013 A3 | 3/1990 |
| EP | 0361456 A2 | 4/1990 |
| EP | 0361456 A3 | 4/1990 |
| EP | 0629834 A1 | 12/1994 |
| EP | 0680103 A1 | 11/1995 |
| EP | 0898180 A2 | 2/1999 |
| EP | 0944888 B1 | 9/1999 |
| EP | 1306687 A2 | 5/2003 |
| EP | 1443332 A1 | 8/2004 |
| EP | 1580560 A1 | 9/2005 |
| EP | 1637898 A1 | 3/2006 |
| EP | 1662353 A1 | 5/2006 |
| EP | 1679524 A1 | 7/2006 |
| EP | 1850143 A1 | 10/2007 |
| EP | 2063229 | 5/2009 |
| EP | 1797496 | 7/2009 |
| EP | 2402719 | 1/2012 |
| EP | 2685273 A1 | 1/2014 |
| EP | 3139190 A1 | 8/2017 |
| FR | 2748105 A1 | 10/1997 |
| FR | 2909756 | 6/2008 |
| GB | 21350660 A | 8/1984 |
| GB | 2276757 A | 10/1994 |
| GB | 24814828 | 12/2011 |
| JP | S 5771504 A | 5/1982 |
| JP | S 60-152950 | 8/1985 |
| JP | S 60182503 A | 9/1985 |
| JP | S 61-4877 | 3/1986 |
| JP | S 6367583 A | 3/1988 |
| JP | 363 084176 A | 4/1988 |
| JP | 63-263782 | 10/1988 |
| JP | 63-300911 | 12/1988 |
| JP | 02-1116753 | 5/1990 |
| JP | H 02-116753 | 5/1990 |
| JP | 03-29817 | 2/1991 |
| JP | H 03-29817 | 2/1991 |
| JP | H 0335182 A | 2/1991 |
| JP | 04-0985817 | 3/1992 |
| JP | H 06-273437 | 9/1994 |
| JP | 08-097486 | 4/1996 |
| JP | 09-1 66612 | 6/1997 |
| JP | 09-166612 | 6/1997 |
| JP | 10-332725 | 12/1998 |
| JP | H 10-318784 | 12/1998 |

(56) References Cited

FOREIGN PATENT DOCUMENTS

| | | |
|---|---|---|
| JP | H 10-318784 A | 12/1998 |
| JP | 11-064363 | 3/1999 |
| JP | 11-074142 | 3/1999 |
| JP | 2000-183241 | 6/2000 |
| JP | 2001-043475 | 2/2001 |
| JP | 2001-141738 | 5/2001 |
| JP | 2001-165702 A | 6/2001 |
| JP | 2001-1659951 | 6/2001 |
| JP | 2002-117500 A | 4/2002 |
| JP | 2002-149013 A | 5/2002 |
| JP | 2002-357920 A | 12/2002 |
| JP | 2003-177171 | 6/2003 |
| JP | 2003-202365 A | 7/2003 |
| JP | 2003-287439 A | 10/2003 |
| JP | WO 2003/107018 A1 | 12/2003 |
| JP | 2004-055932 | 2/2004 |
| JP | 2004-093381 | 3/2004 |
| JP | 2004-152688 | 5/2004 |
| JP | 2004-356338 A | 12/2004 |
| JP | 2004-357858 A | 12/2004 |
| JP | 2005-517928 | 6/2005 |
| JP | 2005-337866 | 12/2005 |
| JP | 2005-345302 | 12/2005 |
| JP | 2006-003096 A | 1/2006 |
| JP | 2006-003116 A | 1/2006 |
| JP | 2006-3116 A | 1/2006 |
| JP | 2006-275764 | 10/2006 |
| JP | 2006-284466 A | 10/2006 |
| JP | 2007-012582 A | 1/2007 |
| JP | 2007-218799 | 8/2007 |
| JP | 2007-240202 | 9/2007 |
| JP | 2008-180550 | 8/2008 |
| JP | 2008-264569 | 11/2008 |
| JP | 2008-286667 A | 11/2008 |
| JP | 2009-002911 A | 1/2009 |
| JP | 2009-222524 | 1/2009 |
| JP | 2009-250725 A | 10/2009 |
| JP | 2009-250931 A | 10/2009 |
| JP | 2010-537207 A | 12/2010 |
| JP | 2011-086479 | 4/2011 |
| JP | 2012-501446 A | 1/2012 |
| KR | 2012-0040247 A | 4/2012 |
| KR | 2013 0019872 A | 2/2013 |
| WO | WO 88/09026 | 11/1988 |
| WO | WO 93/12403 | 6/1993 |
| WO | WO 94/08203 | 4/1994 |
| WO | WO 94/296672 A1 | 12/1994 |
| WO | WO 95/18982 | 7/1995 |
| WO | WO 96/002849 A1 | 2/1996 |
| WO | WO 99/49322 | 9/1999 |
| WO | WO 01/40790 A1 | 6/2001 |
| WO | WO 2001/74139 A2 | 10/2001 |
| WO | WO 2001/74139 A3 | 10/2001 |
| WO | WO 2003/069358 A2 | 8/2003 |
| WO | WO 2003/069358 A3 | 8/2003 |
| WO | WO 2004/027436 | 4/2004 |
| WO | 2004/072672 A1 | 8/2004 |
| WO | 2005/013363 A2 | 2/2005 |
| WO | 2005/013363 A3 | 2/2005 |
| WO | 2006/035342 | 4/2006 |
| WO | 2006/056829 | 6/2006 |
| WO | WO 2006/083479 | 8/2006 |
| WO | WO 2007/095971 A1 | 8/2007 |
| WO | WO 2007/138508 A1 | 12/2007 |
| WO | WO 2008/008140 A2 | 1/2008 |
| WO | WO 2008/008140 A3 | 1/2008 |
| WO | WO 2008/048279 A1 | 4/2008 |
| WO | WO 2008121443 A1 | 10/2008 |
| WO | WO 2008145662 A1 | 12/2008 |
| WO | WO 2009030361 | 3/2009 |
| WO | WO 2009108422 A2 | 9/2009 |
| WO | WO 2009108422 A3 | 9/2009 |
| WO | WO 2010014309 A1 | 2/2010 |
| WO | WO 2010027658 A2 | 3/2010 |
| WO | WO 2010065315 A1 | 6/2010 |
| WO | WO 2010096367 A1 | 8/2010 |
| WO | WO 2011011479 A1 | 1/2011 |
| WO | WO 2012/148646 A1 | 11/2012 |
| WO | WO 2013/169455 | 11/2013 |
| WO | WO 2014/105302 A1 | 7/2014 |
| WO | WO2015/058733 A1 | 4/2015 |

OTHER PUBLICATIONS

U.S. Appl. No. 15/947,251, filed Apr. 6, 2018, Romero.
U.S. Appl. No. 16/102,984, filed Aug. 14, 2018, Almiron et al.
U.S. Appl. No. 16/507,544, filed Jul. 10, 2019, David et al.
U.S. Appl. No. 16/825,368, filed Mar. 20, 2020, Lassalle-Balier et al.
U.S. Non-Final Office Action dated Apr. 2, 2020 for U.S. Appl. No. 15/606,332; 28 Pages.
Response to U.S. Non-Final Office Action dated Jun. 15, 2020 for U.S. Appl. No. 15/606,332; 22 Pages.
U.S. Non-Final Office Action dated Jun. 13, 2019 for U.S. Appl. No. 15/606,332; 23 Pages.
Response to U.S. Non-Final Office Action dated Aug. 26, 2019 for U.S. Appl. No. 15/606,332, 25 Pages.
U.S. Appl. No. 15/606,325, filed May 26, 2017, Romero.
U.S. Appl. No. 15/606,358, filed May 26, 2017, Latham et al.
U.S. Appl. No. 16/856,582, filed Apr. 23, 2020, David et al.
Ahn et al.; "A New Toroidal-Meander Type Integrated Inductor with a Multilevel Meander Magnetic Core;" IEEE Transaction on Magnetics; vol. 30; No. 1; Jan. 1, 1994; 7 pages.
Allegro "Two-Wire True Zero Speed Miniature Differential Peak-Detecting Gear Tooth Sensor;" ATS645LSH; 2004; Allegro MicroSystems, Inc., Worcester, MA 01615; 14 pages.
Allegro Microsystems, Inc., "Gear-Tooth Sensor For Automotive Applications," Aug. 3, 2001; 2 pages.
Allegro MicroSystems, Inc., Hall-Effect IC Applications Guide, http://www.allegromicro.com/en/Products/Design/an/an27701.pdf, Copyright 1987, 1997; 36 pages.
Alllegro "True Zero-Speed Low-Jitter High Accuracy Gear Tooth Sensor;" ATS625LSG; 2005; Allegro MicroSystems, Inc. Worcester, MA 01615; 21 pages.
Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; 8 pages.
Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; 4 pages.
Ausserlechner; "Limits of Offset Cancellation by the Principle of Spinning Current Hall Probe;" Proceedings of IEEE Sensors; Oct. 2004; 4 pages.
Ausserlechner; "The piezo-Hall effect in n-silicon for arbitrary crystal orientation;" Proceedings of IEEE Sensors; vol. 3; Oct. 24, 2004; ISBN: 0-7803-8692-2; 4 pages.
Bahreyni, et al.; "A Resonant Micromachined Magnetic Field Sensor;" IEEE Sensors Journal; vol. 7, No. 9, Sep. 2007; 9 pages.
Barrettino, et al.; "CMOS-Based Monolithic Controllers for Smart Sensors Comprising Micromembranes and Microcantilevers;" IEEE Transactions on Circuits and Systems-I Regular Papers vol. 54, No. 1; Jan. 2007; 12 pages.
Baschirotto et al.; "Development and Analysis of PCB Vector 2-D Magnetic Field Sensor System for Electronic Compass;" IEEE Sensors Journal vol. 6, No. 2; Apr. 2006; 7 pages.
Bilotti et al.; "Monolithic Magnetic Hall Sensor Using Dynamic Quadrature Offset Cancellation;" IEEE Journal of Solid-State Circuits; vol. 32, Issue 6; Jun. 1997; 8 pages.
Bowers et al., "Microfabrication and Process Integration of Powder-Based Permanent Magnets", Interdisciplinary Microsystems Group, Dept. Electrical and Computer Engineering, University of Florida, USA; Technologies for Future Micro-Nano Manufacturing Workshop, Napa, California, Aug. 8-10; 4 pages.
Daughton J: "Spin-dependent sensors", Proceedings of the IEEE New York, US, vol. 91. No. 5 May 1, 2003; 6 pages.

(56) References Cited

OTHER PUBLICATIONS

Demierre, et al.; "Reference Magnetic Actuator for Self-Calibration of a Very Small Hall Sensor Array;" Sensors and Actuators A97-98; Apr. 2002; 8 pages.

Dwyer, "Back-Biased Packaging Advances (SE, SG & SH versus SA & SB)," http://www.allegromicro.com/en/Products/Design/packaging_advances/index.asp, Copyright 2008; 5 pages.

Frick, et al.; "CMOS Microsystem for AC Current Measurement with Galvanic Isolation;" IEEE Sensors Journal; vol. 3, No. 6; Dec. 2003; 9 pages.

Haig; "Piezo-Hall Coefficients of n-Type Silicon;" Journal of Applied Physics; vol. 64, No. 1; Jul. 1, 1988; 7 pages.

Honeywell International, Inc., "Hall Effect Sensing and Application," Micro Switch Sensing and Control, Chapter 3, http://content.honeywell.com/sensing/prodinfo/solidstate/technical/hallbook.pdf, date unavailable but believed to be before Jan. 2008; 11 pages.

Hosticka; "CMOS Sensor Systems;" Sensors and Actuators A66; Apr. 1998; 7 pages.

Infineon Product Brief, TLE 4941plusC, Differential Hall IC for Wheel Speed Sensing, Oct. 2010, www.infineon.com/sensors, 2 pages.

Johnson et al., "Hybrid Hall Effect Device," Appl. Phys. Lett., vol. 71, No. 7, Aug. 1997; 3 pages.

Kammerer et al.: "A Hall effect sensors network insensitive to mechanical stress;" Proceedings of IEEE Sensors; vol. 3, Oct. 2004; 4 pages.

Kanda et al.; "The Piezo-Hall Effect in n-Silicon;" 22nd International Conference on the Physics of Semiconductors; vol. 1, Jan. 1995; 4 pages.

Kapser et al.; "Integrated GMR Based Wheel Speed Sensor for Automotive Applications;" IEEE 2007 Conference on Sensors; Oct. 2007; 4 pages.

Lagorce et al.; "Magnetic and Mechanical Properties of Micromachined Strontium Ferrite/Polyimide Composites;" Journal of Microelectromechanical Systems; vol. 6, No. 4; Dec. 1997; 6 pages.

Lequesne et al.; "High-Accuracy Magnetic Position Encoder Concept;" IEEE Transactions on Industry Applications; vol. 35, No. 3; May/Jun. 1999; 9 pages.

Magnani et al.; "Mechanical Stress Measurement Electronics Based on Piezo-Resistive and Piezo-Hall Effects;" 9th International Conference on Electronics, Circuits and Systems 2002; vol. 1; SBN: 0-7803-7596-3; Dec. 2002; 4 pages.

Manic et al.; "Short and Long-Term Stability Problems of Hall Plates in Plastic Packages;" IEEE 38th Annual International Reliability Physics Symposium; Apr. 2000; 6 pages.

Manic; "Drift in Silicon Integrated Sensors and Circuits Due to the Thermo-Mechanical Stresses;" Lausanne, École Polytechnique Fédérale De Lausanne 2000; 176 pages.

Melexis Microelectronic Systems, Hall Applications Guide, Section 3—Applications, 1997; 48 pages.

Motz et al.; "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN: 1-4244-0079-1; 7 pages.

Motz, et al.; "A Chopped Hall Sensor with Small Jitter and Programmable "True Power-On" Function;" IEEE Journal of Solid-State Circuits; vol. 40, No. 7; Jul. 2005; 8 pages.

Motz, et al.; "An Integrated Hall Sensor Platform Design for Position, Angle and Current Sensing;" IEEE Sensors 2006; Exco, Daegu, Korea/Oct. 22-25, 2006; 4 pages.

Munter; "A Low-offset Spinning-current Hall Plate;" Sensors and Actuators A21-A23; 1990; 4 pages.

Munter; "Electronic Circuitry for a Smart Spinning-current Hall Plate with Low Offset;" Sensors and Actuators A; June ! 99!; 5 pages.

Oniku et al.; "High-Energy-Density Permanent Micromagnets Formed from Heterogeneous Magnetic Powder Mixtures;" IEEE 25th International Conference on Micro Electro Mechanical Systems, Jan. 2012; 4 pages.

Park et al.; "Ferrite-Based Integrated Planar Inductors and Transformers Fabricated at Low Temperature;" IEEE Transactions on Magnetics; vol. 33; No. 5; Sep. 1997; 3 pages.

Park et al.; "Batch-Fabricated Microinductors with Electroplated Magnetically Anisotropic and Laminated Alloy Cores", IEEE Transactions on Magnetics, vol. 35, No. 5, Sep. 1999, 10 pages.

Partin et al.; "Temperature Stable Hall Effect Sensors;" IEEE Sensors Journal, vol. 6, No. 1; Feb. 2006; 5 pages.

Pastre, et al.; "A Hall Sensor Analog Front End for Current Measurement with Continuous Gain Calibration;" IEEE Sensors Journal; vol. 7, No. 5; May 2007; 8 pages.

Pastre, et al.; "A Hall Sensor-Based Current Measurement Microsystem With Continuous Gain Calibration;" Research in Microelectronics and Electronics, IEEE vol. 2; Jul. 25; 2005; ISBN: 0-7803-9345-7; 4 pages.

Popovic; "Sensor Microsystems;" Proc. $20^{th}$ International Conference on Microelectronics (MWIL 95); vol. 2, NIS, Serbia, 12-14; Sep. 1995; 7 pages.

Randhawa; "Monolithic Integrated Hall Devices in Silicon Circuits;" Microelectronics Journal; vol. 12, No. 6; Sep. 14-17, 1981; 6 pages.

Ruther et al.; "Integrated CMOS-Based Sensor Array for Mechanical Stress Mapping;" 5th IEEE Conference on Sensors, Oct. 2007; 4 pages.

Ruther et al.; "Thermomagnetic Residual Offset in Integrated Hall Plates;" IEEE Sensors Journal; vol. 3, No. 6; Dec. 2003; 7 pages.

Sargent; "Switched-capacitor IC controls feedback loop;" EDN; Design Ideas; Feb. 17, 2000; 2 pages.

Schneider; "Temperature Calibration of CMOS Magnetic Vector Probe for Contactless Angle Measurement System," IEDM 1996 4 Pages.

Schott et al.; "Linearizing Integrated Hall Devices;" 1997 International Conference on Solid-State Sensors and Actuators, Jun. 16-19, 1997; 4 Pages.

Schott, et al.; "CMOS Single-Chip Electronic Compass with Microcontroller;" IEEE Journal of Solid-State Circuits; vol. 42, No. 12; Dec. 2007; 11 pages.

Simon et al.; "Autocalibration of Silicon Hall Devices;" 8th International Conference on Solid-State Sensors and Actuators; vol. 2; Jun. 25, 1995; 4 pages.

Smith et al.; "Low Magnetic Field Sensing with GMR Sensors;" Sensor Magazine; Part 1; Sep. 1999; http://archives.sensorsmag.com/articles/0999/76mail.shtml; pp. 1-8.

Smith et al.; "Low Magnetic Field Sensing with GMR Sensors;" Sensor Magazine; Part 2; Oct. 1999; http://archives.sensorsmag.com/articles/1099/84/mail.shtml; pp. 1-11.

Steiner et al.; "Double-Hall Sensor with Self-Compensated Offset;" International Electron Devices Meeting; Dec. 7, 1997; ISBN: 0-7803-4100-7; 4 pages.

Steiner et al.; Offset Reduction in Hall Devices by Continuous Snipping Current Method; Sensors and Actuators A66; 1998; ISBN: 6 pages.

Stellrecht et al.; Characterization of Hygroscopic Swelling Behavior of Mold Compounds and Plastic Packages; IEEE Transactions on Components and Packaging Technologies; vol. 27, No. 3; Sep. 2004; 8 pages.

Tian et al.; "Multiple Sensors on Pulsed Eddy-Current Detection for 3-D Subsurface Crack Assessment;" IEEE Sensors Journal, vol. 5, No. 1; Feb. 2005; 7 pages.

Trontelj et al.; "CMOS Integrated Magnetic Field Source Used as a Reference in Magnetic Field Sensors on Common Substrate;" WEP 1-6; IMTC; May 1994; 3 pages.

Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; 3 pages.

Zou et al.; "Three-Dimensional Die Surface Stress Measurements in Delaminated and Non-Delaminated Plastic Packages;" 48th Electronic Components and Technology Conference; May 25, 1998; 12 pages.

Office Action dated Jan. 15, 2014 for U.S. Appl. No. 13/468,478, 36 pages.

(56) References Cited

OTHER PUBLICATIONS

Response to Office Action dated Jan. 15, 2014 for U.S. Appl. No. 13/468,478; Response filed on Jun. 12, 2014; 11 Pages.
Final Office Action dated Jul. 17, 2014 for U.S. Appl. No. 13/468,478; 13 Pages.
Response and RCE to U.S. Final Office Action dated Jul. 17, 2014 for U.S. Appl. No. 13/468,478; Response Filed Jan. 19, 2015; 12 Pages.
Office Action dated Feb. 12, 2015 for U.S. Appl. No. 13/468,478; 14 Pages.
Response to Office Action dated Feb. 12, 2015 for U.S. Appl. No. 13/468,478; Response filed Jun. 18, 2015; 11 Pages.
Final Office Action dated Sep. 16, 2015 for U.S. Appl. No. 13/468,478; 19 Pages.
Response (with RCE) to U.S. Final Office Action dated Sep. 16, 2015 for U.S. Appl. No. 13/468,478; Response filed Jan. 14, 2016; 18 Pages.
Office Action dated May 10, 2016 for U.S. Appl. No. 13/468,478; 20 Pages.
Response to the Office Action dated May 10, 2016; filed on Oct. 3, 2016 for U.S. Appl. No. 13/468,478; 17 pages.
Office Action dated Feb. 10, 2017 for U.S. Appl. No. 13/468,478; 27 Pages.
Response to Final Office Action dated Feb. 10, 2017 for U.S. Appl. No. 13/468,478; Response filed on May 3, 2017; 9 Pages.
Notice of Allowance dated May 15, 2017 for U.S. Appl. No. 13/468,478; 15 Pages.
Notice of Allowance dated Jul. 25, 2017 for U.S. Appl. No. 13/468,478; 10 Pages.
PCT Search Report and Written Opinion of the ISA dated Jul. 13, 2013; For PCT Pat. App. No. PCT/US2013/037065; 13 pages.
PCT International Preliminary Report on Patentability dated Nov. 20, 2014 for International Application No. PCT/US2013/037065; 11 pages.
European Response to Written Opinion filed on May 21, 2015; for European Pat. App. No. 13722619.7, 9 pages.
European Communication under Rule 71(3) EPC, Intention to Grant dated Jun. 2, 2016 corresponding to European Application No. 13722619.7; 26 Pages.
Decision to Grant dated Oct. 27, 2016; for European Pat. App. No. 13722619.7; 2 pages.
Japanese Office Action (with English Translation) dated Jan. 13, 2017 for Japanese Application No. 2015-511491; 14 Pages.
Response (with Amended Claims in English) to Japanese Office Action dated Feb. 13, 2017 for Japanese Application No. 2015-511491; Response filed on Apr. 11, 2017; 10 Pages.
Appeal Brief dated Sep. 19, 2017 from Japanese Application No. 2015-511491 with English translations; 14 Pages.
Pre-Trial Report dated Nov. 2, 2017 from Japanese Application No. 2015-511491 with English translations and Claims on File; 7 Pages.
Japanese Office Action (with English Translation) dated May 18, 2017 for Japanese Application No. 2015-511491; 8 Pages.
Japanese Petition (with Machine English Translation) filed Jan. 24, 2018 for Japanese Application No. 2015-511491; 10 Pages.
Japanese Office Action (with English Translation) dated May 16, 2018 for Japanese Application No. 2015-511491; 9 Pages.
Reponse filed on Nov. 14, 2018 for for Japanese Application No. 2015-511491 with English Translation; 11 Pages.
Japanese Office Action dated Dec. 17, 2018 for Japanese Application No. 2015-511491; 10 pages.
Response filed on Mar. 14, 2019 for Japanese Application No. 2015-511491 with English Machine Translation; 12 Pages.
Japanese Notice of Allowance (with English Translation of Allowed Claims) dated May 16, 2019 for Japanese Application No. 2015-511491; 6 Pages.
Korean Office Action (with English Translation) dated Dec. 20, 2017 corresponding to Korean Appl. No. 10-2014-7032857; 14 Pages.

Response (with English Translation) to Korean Notice of Reasons for Refusal dated Dec. 20, 2017 for Korean Application No. 10-2014-7032857; Response filed Feb. 14, 2018; 47 Pages.
Korean Notice of Allowance (with English translation and allowed claims) dated Jun. 29, 2018 for Korean Application No. 10-2014-7032857; 8 pages.
Office Action dated Jan. 9, 2018 corresponding to U.S. Appl. No. 15/709,739; 12 Pages.
Response to U.S. Non-Final Office Action dated Jan. 9, 2018 for U.S. Appl. No. 15/709,739; Response filed Jun. 25, 2018; 11 pages.
Final Office Action dated Oct. 25, 2018 for U.S. Appl. No. 15/709,739; 14 Pages.
Response to Final Office Action dated Oct. 25, 2018 for U.S. Appl. No. 15/709,739 as filed on Jan. 18, 2019; 10 Pages.
Office Action dated Mar. 8, 2019 for U.S. Appl. No. 15/709,739; 15 Pages.
Response to U.S. Non-Final Office Action dated Mar. 8, 2019 for U.S. Appl. No. 15/709,739; Response filed Jun. 10, 2019; 15 Pages.
Appeal Brief filed Mar. 19, 2020 for U.S. Appl. No. 15/709,739, 18 pages.
Office Action dated Jul. 28, 2020 for U.S. Appl. No. 15/709,739, 19 Pages.
Final Office Action dated Sep. 19, 2019 for U.S. Appl. No. 15/709,739; 24 Pages.
Response to Office Action filed on Nov. 12, 2020 for U.S. Appl. No. 15/709,739; 17 pages.
U.S. Final Office Action dated Mar. 2, 2021 for U.S. Appl. No. 15/709,739; 17 pages.
Appeal Brief filed on Aug. 17, 2021 for U.S. Appl. No. 15/709,739; 15 Pages.
European Extended Search Report dated Dec. 22, 2016; for European Pat. App. No. 16193227.2; 11 pages.
Response to Official Communication dated Mar. 13, 2017 filed on Oct. 2, 2017 for European Application No. 16193227.2; 7 pages.
European Examination Report dated May 15, 2020 for European Application No. 16193227.2, 8 pages.
Response to European Office Action filed on Sep. 15, 2020 for European Application No. 16193227.2; 9 pages.
European Intention to Grant dated Mar. 10, 2021 for European Application No. 16193227.2; 7 Pages.
Japanese Office Action with English Translations for Japanese Application No. 2017-178549 dated Jul. 30, 2018; 4 Pages.
Response filed on Nov. 14, 2018 for Japanese Application No. 2017-178549 with English Translation; 13 Pages.
Notice of Allowance dated Apr. 16, 2019 for Japanese Application No. 2017-178549 with English Translation of Allowed claims; 8 Pages.
Office Action dated Jan. 5, 2015 for U.S. Appl. No. 13/946,400; 56 Pages.
Response to Office Action dated Jan. 5, 2015, filed Apr. 3, 2015; for U.S. Appl. No. 13/946,400; 13 pages.
Final Office Action dated Jun. 9, 2015; for U.S. Appl. No. 13/946,400; 17 pages.
Amendment and RCE filed on Sep. 9, 2015; for U.S. Appl. No. 13/946,400; 12 pages.
Office Action dated Nov. 19, 2015; for U.S. Pat. U.S. Appl. No. 13/946,400; 24 pages.
Response to U.S. Non-Final Office Action dated Nov. 19, 2015 for U.S. Appl. No. 13/946,400; Response filed Feb. 17, 2016; 11 Pages.
Final Office Action dated Oct. 20, 2016 for U.S. Appl. No. 13/946,400; 34 pages.
Response to Final Office Action dated Oct. 20, 2016, filed on Jan. 19, 2017; for U.S. Appl. No. 13/946,400; 12 pages.
Response to U.S. Final Office Action dated Oct. 20, 2016 (w/RCE) for U.S. Appl. No. 13/946,400; Response filed on Feb. 23, 2017; 17 Pages.
Advisory Action dated Feb. 16, 2017 for U.S. Appl. No. 13/946,400; 4 Pages.
Office Action dated Apr. 6, 2017 for U.S. Appl. No. 13/946,400; 36 Pages.
Response to Office Action filed on Jun. 30, 2017 for U.S. Appl. No. 13/946,400; 12 pages.

(56) References Cited

OTHER PUBLICATIONS

Final Office Action dated Oct. 5, 2017 for U.S. Appl. No. 13/946,400; 39 pages.
Response to U.S. Final Office Action dated Oct. 5, 2017 for U.S. Appl. No. 13/946,400; Response filed Jan. 5, 2018; 11 Pages.
Response to Final Office Action dated Oct. 5, 2017 for U.S. Appl. No. 13/946,400; Response filed on Feb. 27, 2018; 14 Pages.
Notice of Allowance dated Apr. 4, 2018 for U.S. Appl. No. 13/946,400; 11 pages.
International Search Report and Written Opinion dated Nov. 3, 2014 for Int'L PCT Application PCT/US2014/044993; 13 pages.
International Preliminary Report on Patentability dated Jan. 19, 2016 for Int'l PCT Application PCT/US2014/044993; 9 pages.
Communication Pursuant to Rule 161(1) and 162 EPC dated Feb. 23, 2016; for European Pat. App. No. 14742423.8; 2 pages.
European Response filed on Aug. 24, 2016 to the official communication dated Feb. 23, 2016; for European Pat. App. No. 14742423.8; 13 pages.
European Examination Report dated Jan. 27, 2020 for European Application No. 14742423.8; 7 Pages.
Response (with Amended Claims) to European Examination Report dated Jan. 27, 2020 for European Application No. 14742423.8; Response Filed May 27, 2020; 10 Pages.
Japanese Voluntary Amendment with English Claims dated Dec. 28, 2016; for Japanese Pat. App. No. 2016-528006; 8 pages.
Japanese Officec Action (with English translation) dated Oct. 3, 2017 for Japanese Application No. 2016-528006; 6 pages.
Response to Japanese Office Action (with English claims) dated Oct. 3, 2017 for Japanese Application No. 2016-528006; Response filed Dec. 26, 2017; 8 Pages.
Japanese Office Action (with English translation) dated Jun. 1, 2018 for Japanese Application No. 2016-528006; 7 pages.
Response to Japanese Office Action with English translations of Amended Claims for Japanese Application No. 2016-528006 as filed on Aug. 3, 2018; 7 Pages.
Japanese Notice of Allowance (with English Translation) dated Sep. 28, 2018, for Japanese Application No. 2016-528006; 6 Pages.
Voluntary Amendment with English Claims dated Nov. 7, 2016 for Korean App. No. 10-2016-7004178; 11 Pages.
Korean Office Action with English Translation dated Nov. 22, 2017 for Korean Application No. 10-2016-7004178; 17 Pages.
Korean Response (with English Language Summary) dated Jan. 19, 2018 for Korean Application No. 10-2016-7004178; 25 Pages.
Korean Office Action (with English Translation) dated May 30, 2018 for Korean Application No. 10-2016-7004178; 11 Pages.
Response to Korean Office Action dated May 30, 2018 for Korean Application No. 10-2016-7004178; Response (with English claims) filed Jul. 19, 2018; 41 pages.
Korean Notice of Allowance (with English Translation) dated Oct. 2, 2018, for Korean Application No. 10-2016-7004178; 5 Pages.
Voluntary Amendment dated Nov. 2, 2016 with English claims for Chinese Application No. 201480040243.6; 13 pages.
Response to Chinese Office Action dated Feb. 1, 2018 for Chinese Application No. 201480040243.6; Response filed Jun. 14, 2018; 11 pages.
Second Office Action dated Oct. 9, 2018 for Chinese Application No. 201480040243.6 with English Translations; 23 Pages.
Chinese Response (w/English Claims and Remarks) filed Dec. 24, 2018 for Chinese Application No. 201480040243.6; 14 pages.
Office Action dated Mar. 22, 2019 for Chinese Application No. 201480040243.6 with English Translation; 22 Pages.
Response filed on Jun. 6, 2019 for Chinese Application No. 201480040243.6; 17 Pages.
Chinese Decision on Rejection (with English Translation) dated Sep. 3, 2019 for Chinese Application No. 201480040243.6; 23 Pages.
Response with English Translation and Amended Claims in English to Chinese Office Action dated Sep. 3, 2019 for Chinese Application No. 2014800402436; Response filed on Dec. 17, 2019; 17 Pages.
Chinese Notice of Grant (with English Translation and Allowed Claims) dated Jan. 9, 2020 for Chinese Application No. 201480040243.6; 11 Pages.
Office Action dated Oct. 5, 2018, for U.S. Appl. No. 16/029,826; 61 Pages.
Response to U.S. Non-Final Office Action dated Oct. 5, 2018 for U.S. Appl. No. 16/029,826; Response filed Feb. 1, 2019; 10 pages.
Final Office Action dated Sep. 19, 2019 for U.S. Appl. No. 16/029,826; 22 Pages.
Response to U.S. Final Office Action dated Sep. 19, 2019 for U.S. Appl. No. 16/029,826; Response filed Oct. 21, 2019; 12 Pages.
Office Action dated Nov. 29, 2019 for U.S. Appl. No. 16/029,826; 30 Pages.
Response to Office Action filed on Jan. 17, 2020 for U.S. Appl. No. 16/029,826; 14 pages.
U.S. Notice of Allowance dated Mar. 23, 2020 for U.S. Appl. No. 16/029,826; 13 Pages.
U.S. Non-Final Office Action dated Feb. 19, 2021 for U.S. Appl. No. 16/856,582; 37 Pages.
Response to U.S. Non-Final Office Action dated Feb. 19, 2021 for U.S. Appl. No. 16/856,582; Response Filed Mar. 2, 2021; 11 Pages.
U.S. Final Office Action dated Sep. 14, 2021 for U.S. Appl. No. 16/856,582; 21 Pages.
Office Action dated Aug. 24, 2015 for U.S. Appl. No. 13/891,519; 14 pages.
Response to U.S. Non-Final Office Action dated Aug. 24, 2015 for U.S. Appl. No. 13/891,519; Response filed on Nov. 20, 2015; 11 pages.
Final Office Action dated Feb. 16, 2016 for U.S. Appl. No. 13/891,519; 14 pages.
Response and RCE to U.S. Final Office Action dated Feb. 16, 2016 for U.S. Appl. No. 13/891,519; Response filed on May 12, 2016; 13 pages.
Office Action dated Jun. 3, 2016 for U.S. Appl. No. 13/891,519; 19 pages.
Response to Office Action dated Jun. 3, 2016 for U.S. Appl. No. 13/891,519; Response filed on Sep. 1, 2016; 14 pages.
Final Office Action dated Nov. 25, 2016 for U.S. Appl. No. 13/891,519; 13 pages.
Response and RCE to U.S. Final Office Action dated Nov. 25, 2016 for U.S. Appl. No. 13/891,519; Response filed on Feb. 6, 2017; 18 pages.
Notice of Allowance dated Mar. 1, 2017 for U.S. Appl. No. 13/891,519; 11 pages.
Notice of Allowance dated Apr. 19, 2017 for U.S. Appl. No. 13/891,519; 11 pages.
PCT International Search Report and Written Opinion dated Sep. 12, 2014 for International Application No. PCT/US2014/035594; 16 pages.
PCT International Preliminary Report dated Nov. 19, 2015 for International Application No. PCT/US2014/035594; 13 pages.
Communication Pursuant to Rules 161(1) and 162 dated Nov. 12, 2015 for European Application No. 14726492.3-1560; 2 pages.
Response to Communication dated Dec. 11, 2015 for European Application No. 14726492.3-1560; 17 pages.
Intention of Grant dated May 27, 2019 for for European Application No. 14726492.3-1560; 7 pages.
Japanese Office Action dated Jan. 18, 2017 for Japanese Application No. 2016-512930; 7 pages.
Response to Japanese Office Action dated Jan. 18, 2017 for Japanese Application No. 2016-512930; Response Filed Apr. 18, 2017; 13 pages.
Japanese Decision of Grant dated Oct. 25, 2018 for Japanese Application No. 2016-512930; Response Filed Apr. 18, 2017; 27 pages.
Office Action dated Mar. 20, 2015; for U.S. Pat. U.S. Appl. No. 13/946,417; 20 pages.
Response filed on Jun. 19, 2015 to Office Action dated Mar. 20, 2015; for U.S. Appl. No. 13/946,417; 15 pages.
Final Office Action dated Aug. 28, 2015; for U.S. Appl. No. 13,946,417; 30 pages.
Response filed on Nov. 9, 2015 to Final Office Action dated Aug. 28, 2015; For U.S. Appl. No. 13/946,417; 14 pages.

(56) References Cited

OTHER PUBLICATIONS

Non-Final Office Action dated Dec. 3, 2015; for U.S. Appl. No. 13/946,417; 26 pages.
Response filed Mar. 3, 2016 to Office Action dated Dec. 3, 2015; For U.S. Appl. No. 13/946,417; 17 pages.
Final Office Action dated Oct. 6, 2016; for U.S. Appl. No. 13/946,417; 29 pages.
Response and RCE to Oct. 6, 2016 Final Office Action from U.S. Appl. No. 13/946,417 as filed on Jan. 24, 2017; 14 Pages.
Office Action dated Mar. 15, 2017 from U.S. Appl. No. 13/946,417; 25 Pages.
Response to U.S. Non-Final Office Action dated Mar. 15, 2017 for U.S. Appl. No. 13/946,417; Response filed on Jun. 14, 2017; 10 pages.
Final Office Action dated Sep. 8, 2017 for U.S. Appl. No. 13/946,417; 56 pages.
Response to Final Office Action dated Sep. 8, 2017 for U.S. Appl. No. 13/946,417; Response filed Nov. 29, 2017; 13 Pages.
Office Action dated Feb. 8, 2018 for U.S. Appl. No. 13/946,417; 27 Pages.
Response to U.S. Non-Final Office Action dated Feb. 8, 2018 for U.S. Appl. No. 13/946,417; Response filed Apr. 19, 2018; 14 Pages.
Final Office Action dated Jun. 15, 2018 for U.S. Appl. No. 13/946,417; 33 Pages.
Response to Final Office Action dated Jun. 15, 2018 for U.S. Appl. No. 13/946,417 as filed on Sep. 14, 2018; 15 Pages.
Office Action dated Feb. 7, 2019 for U.S. Appl. No. 13/946,417; 35 pages.
Response to U.S. Non-Final Office Action dated Feb. 7, 2019 for U.S. Appl. No. 13/946,417; Response filed Apr. 22, 2019; 14 pages.
Notice of Allowance dated Sep. 11, 2019 for U.S. Appl. No. 13/946,417; 10 Pages.
Supplemental Notice of Allowability dated Oct. 2, 2019 for U.S. Appl. No. 13/946,417; 7 Pages.
International Search Report and Written Opinion dated Oct. 28, 2014 for Int'l PCT Application PCT/US2014/044991; 12 pages.
PCT International Preliminary Report and Written Opinion dated Jan. 28, 2016 for International Application No. PCT/US2014/044991; 9 pages.
U.S. Non-Final Office Action dated Jan. 24, 2019 for U.S. Appl. No. 15/606,358; 27 pages.
Response to Non-Final Office Action dated Jan. 24, 2019 for U.S. Appl. No. 15/606,358 as filed on Apr. 17, 2019; 12 Pages.
Non-Final Office Action dated Aug. 22, 2019 for U.S. Appl. No. 15/606,358; 32 Pages.
Response to U.S. Non-Final Office Action dated Aug. 22, 2019 for U.S. Appl. No. 15/606,358; Response filed Dec. 4, 2019; 20 Pages.
U.S. Final Office Action dated Mar. 6, 2020 for U,S, U.S. Appl. No. 15/606,358; 43 Pages.
RCE and Response to U.S. Final Office Action dated Mar. 6, 2020 for U.S. Appl. No. 15/606,358; Response filed Jul. 1, 2020, 16 Pages.
U.S. Notice of Allowance dated Feb. 16, 2021 for U.S. Appl. No. 15/606,358; 10 Pages.
PCT International Search Report and Written Opinion dated Nov. 23, 2018 for International Application No. PCT/US2018/028475; 17 pages.
PCT International Preliminary Report dated Dec. 5, 2019 for International Application No. PCT/US2018/028475; 11 Pages.
Communication pursuant to Rules 161(1) and 162 EPC dated Jan. 10, 2020 for European Application No. 18723635.1; 3 pages.
Response to European Rules 161/162 Communication dated Jan. 10, 2020 for European Application No. 18723635.1; Response filed Jul. 17, 2020; 18 Pages.
Chinese Office Action with English Translation dated Jun. 2, 2021 for Chinese Application No. 201880034849.7; 29 Pages.

Response (with English Translation) to 1S' Chinese Office Action dated Jun. 2, 2021 for Chinese Application No. 201880034849.7; Response filed on Jul. 30, 2021; 19 Pages.
$2^{nd}$ Chinese Office Action (with English Translation) dated Aug. 25, 2021 for Chinese Application No. 201880034849.7; 12 Pages.
Response (with English Translation) to $2_{nd}$ Chinese Office Action dated Aug. 25, 2021 for Chinese Application No. 201880034849.7; Response filed Sep. 28, 2021; 60 Pages.
Restriction Requirement dated Jan. 10, 2019 for U.S. Appl. No. 15/606,332; 12 pages.
Response to Restriction Requirement dated Jan. 10, 2019 for U.S. Appl. No. 15/606,332; filed on Mar. 6, 2019, 13 pages.
Final Office Action dated Nov. 27, 2019 for U.S. Appl. No. 15/606,332; 29 pages.
Response to Final Office Action dated Nov. 27, 2019 filed on Feb. 7, 2020 for U.S. Appl. No. 15/606,332; 19 pages.
Final Office Action dated Sep. 17, 2020 for U.S. Appl. No. 15/606,332; 21 pages.
Response to Final Office Action dated Sep. 17, 2020 filed on Dec. 2, 2020 for U.S. Appl. No. 15/606,332; 23 pages.
Office Action dated Mar. 24, 2021 for U.S. Appl. No. 15/606,332; 23 pages.
Response to Office Action dated Mar. 24, 2021 filed on Jun. 24, 2021 for U.S. Appl. No. 15/606,332; 21 pages.
PCT International Search Report and Written Opinion of the ISA dated Aug. 10, 2018 for PCT/US2018/028816; 23 Pages.
PCT International Preliminary Report dated Dec. 5, 2019 for International Application No. PCT/US2018/028816; 18 Pages.
Communication pursuant to Rules 161(1) and 162 EPC dated Jan. 10, 2020 for European Application No. 18726263.9; 3 pages.
Response to European Rules 161/162 Communication dated Jan. 10, 2020 for European Application No. 18726263.9; Response filed Jul. 10, 2020; 18 Pages.
European Examination Report dated Aug. 5, 2021 for for European Application No. 18726263.9; 4 Pages.
Chinese Office Action (with English Translation) dated Mar. 3, 2021 for Chinese Application No. 201880034743.7; 22 Pages.
Response to Chinese Office Action dated Mar. 3, 2021 for Chinese Application No. 201880034743.7; Response filed on Jul. 16, 2021; 23 Pages.
$2^{nd}$ Chinese Office Action (with English Translation) dated Oct. 9, 2021 for Chinese Application No. 201880034743.7; 19 Pages.
Office Action dated Nov. 8, 2018 for U.S. Appl. No. 15/606,325; 24 Pages.
Response to Office Action dated Nov. 8, 2018 for U.S. Appl. No. 15/606,325; Response filed Feb. 7, 2019; 14 pages
Final Office Action dated May 16, 2019 for U.S. Appl. No. 15/606,325; 24 Pages.
Response to Final Office Action dated May 16, 2019 for U.S. Appl. No. 15/606,325 as filed on Aug. 14, 2019; 15 Pages.
U.S. Notice of Allowance dated Jul. 28, 2020 for U.S. Appl. No. 15/606,325, 33 pages.
PCT International Search Report and Written Opinion dated Nov. 30, 2018 for International Application No. PCT/US2018/028821; 12 pages.
PCT International Preliminary Report dated Dec. 5, 2019 for International Application No. PCT/US2018/028821; 8 Pages.
Communication pursuant to Rules 161(1) and 162 EPC dated Jan. 10, 2020 for European Application No. 18723644.3; 3 pages.
Response to European Office Action filed on Jul. 17, 2020 for European Application No. 18723644.3; 17 pages.
Japanese Voluntary Amendment (with Machine English Translation from Espacenet.com) filed on Nov. 13, 2020 for Japanese Application No. 2019-565298; 4 Pages.
Chinese Office Action with English Translation dated Jun. 18, 2021 for Chinese Application No. 201880034726.3; 21 Pages.
Response (with English Translation) to 1S' Chinese Office Action dated Jun. 18, 2021 for Chinese Application No. 201880034726.3; Response filed on Aug. 23, 2021; 18 Pages.

* cited by examiner

STRAY-FIELD-IMMUNE COIL-ACTIVATED POSITION SENSOR

BACKGROUND

Magnetic field sensors are often used to detect a ferromagnetic target. They often act as sensors to detect motion or position of the target. Such sensors are ubiquitous in many areas of technology including robotics, automotive, manufacturing, etc. Magnetic field sensors generally employ one or more magnetic field sensing elements, such as Hall effect elements, magnetoresistors, etc. These elements can be positioned relative to a magnetic field so that they are relatively sensitive or relatively insensitive to the magnetic field. Magnetoresistors can be designed and/or positioned so that their resistance will increase in response to a magnetic field or decrease in response to the magnetic field.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to aspects of the disclosure, a sensor is provided comprising: a first magnetoresistive (MR) bridge having a first stray field sensitivity; a second MR bridge having a second stray field sensitivity; and a driver circuitry configured to: (i) supply a first voltage to the first MR bridge, and (ii) supply a second voltage to the second MR bridge that is different from the first voltage, wherein supplying the first voltage and the second voltage to the first MR bridge and the second MR bridge, respectively, causes the first stray field sensitivity to match the second stray field sensitivity.

According to aspects of the disclosure, a method is provided for use in a sensor having a first MR bridge and a second MR bridge that are operatively coupled to a processing circuitry, the method comprising: driving the first MR bridge with a first voltage, the first MR bridge having a first stray field sensitivity; driving the second MR bridge with a second voltage, the second MR bridge having a second stray field sensitivity; and calculating, by the processing circuitry, a position of a target based on a first signal that is provided by the first MR bridge and a second signal that is provided by the second MR bridge, wherein supplying the first voltage and the second voltage to the first MR bridge and the second MR bridge, respectively, causes the first stray field sensitivity to match the second stray field sensitivity.

According to aspects of the disclosure, a sensor is provided, comprising: a coil formed on a substrate, the coil having a first coil turn and a second coil turn, the second coil turn being formed outside of the first coil turn; a secondary loop that is coupled to the coil, the secondary loop being formed inside the first coil turn; a first MR bridge that is formed on the substrate, the first MR bridge including a first plurality of MR elements that are formed between the first coil turn and the second coil turn; a second MR bridge that is formed on the substrate, the second MR bridge including a second plurality of MR elements that are formed inside the first coil turn and inside the secondary loop, wherein the second MR bridge is centered with the first coil turn.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Figure 1:
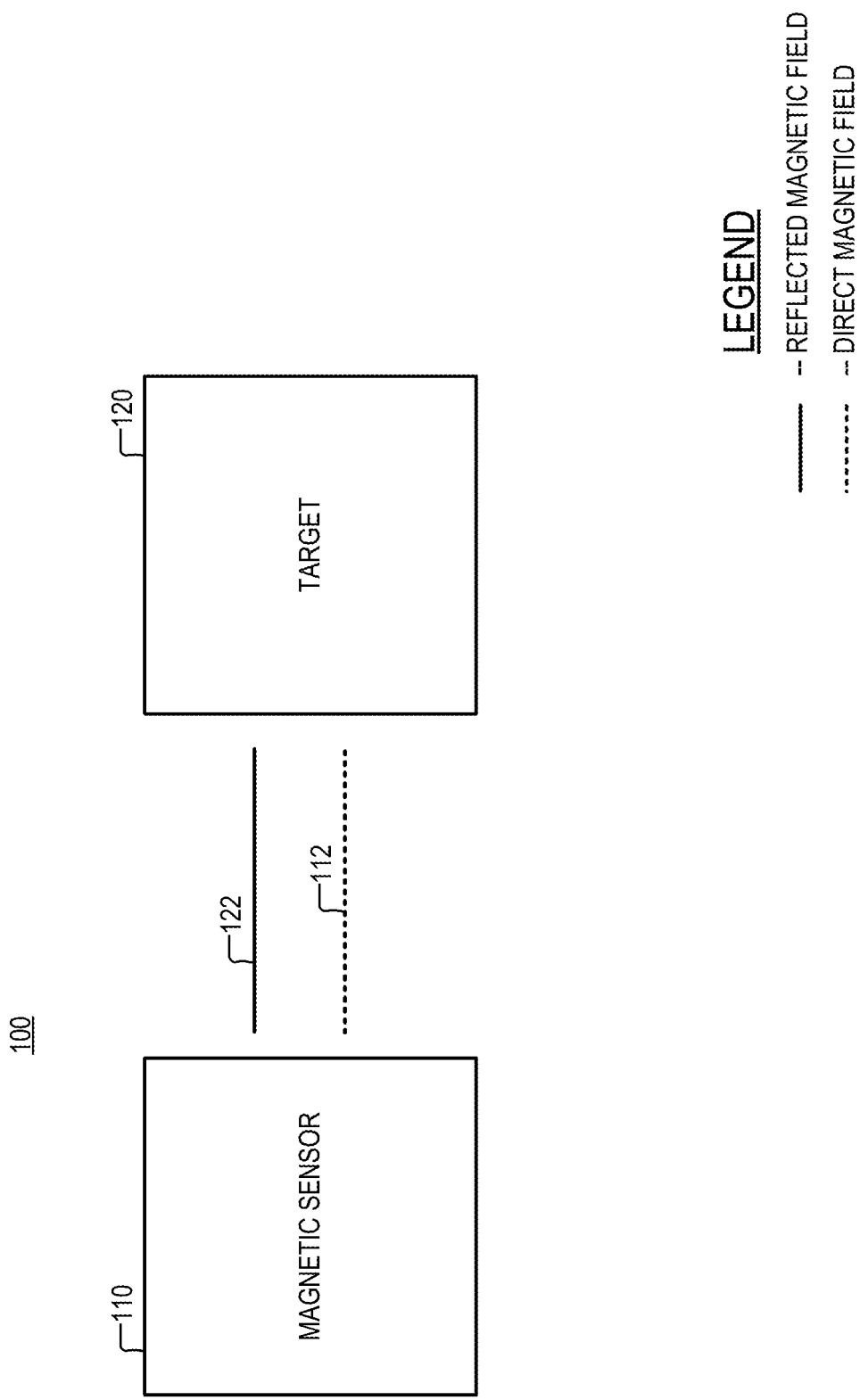
FIG. 1 is a diagram of an example of a system including a sensor and a target, according to aspects of the disclosure.

FIG. 1 is a diagram of an example of a system 100, according to aspects of the disclosure. As illustrated, the system 100 includes a sensor 110 and a target 120. In operation, the sensor 110 may generate a first magnetic field 112 (hereinafter "direct magnetic field 112"), as shown. The direct magnetic field 112 may induce a second magnetic field 122 (hereinafter "reflected magnetic field 122") in the target 120. The sensor 110 may detect the magnetic flux density of the reflected magnetic field 122 and determine the position of the target 120 based on the magnetic flux density of the reflected magnetic field 122.

Figure 2:
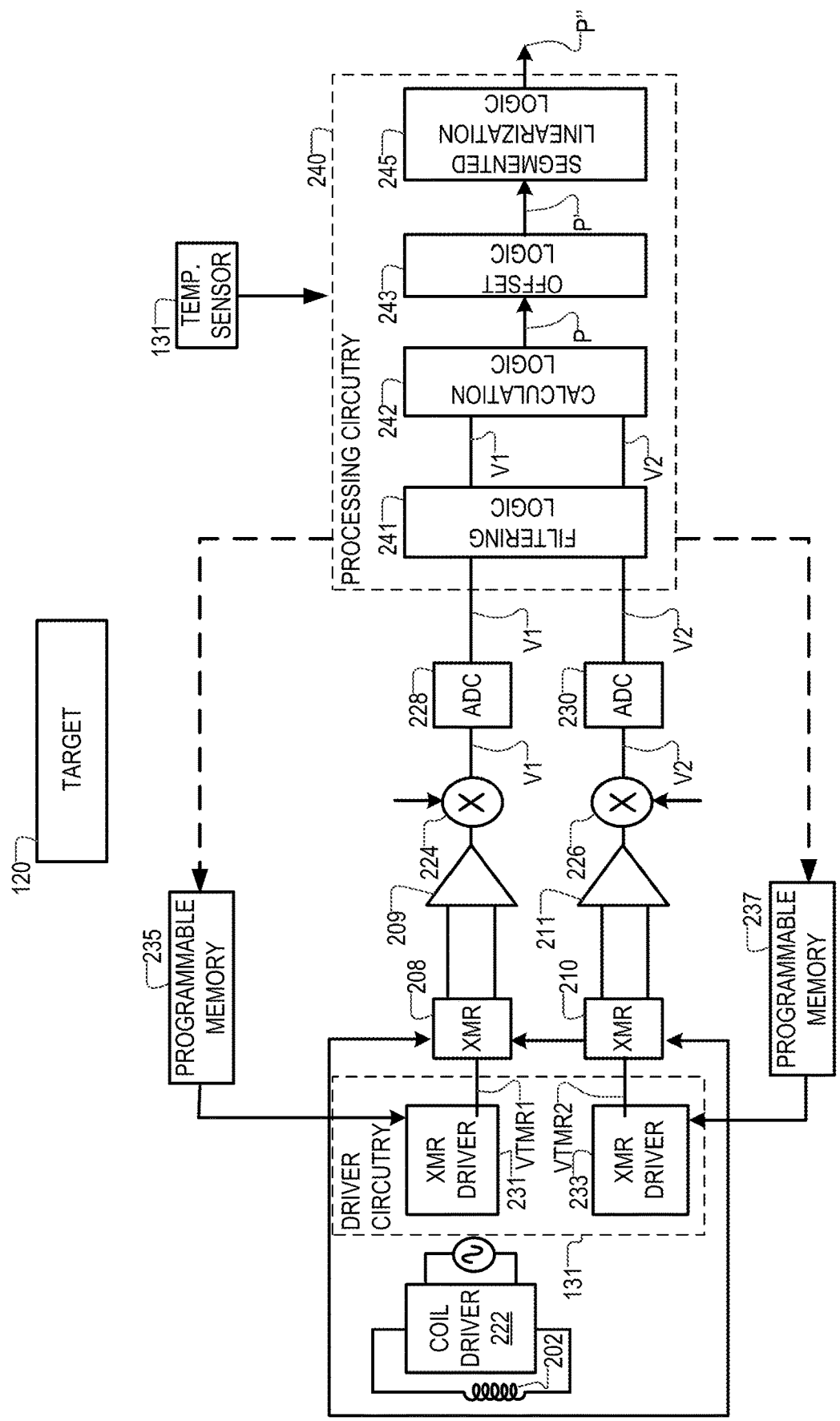
FIG. 2 is a circuit diagram of a sensor, according to aspects of the disclosure.

FIG. 2 is a circuit diagram showing an example electrical layout of the sensor 110 in further detail. As illustrated, the sensor 110 may include a coil 202 and a coil driver 222. Coil 202 may be configured to generate the direct magnetic field 112 when current supplied by the coil driver 222 flows through it. Coil driver 222 may include a power circuit that supplies alternating current to coil 202 to generate the direct magnetic field 112.

The sensor 110 may further include an MR bridge 208 and an MR bridge 210. As is discussed further below with respect to FIGS. 3-6, each of the bridge 208 and bridge 210 may include a full-bridge circuit that is formed of a plurality of magnetic field sensing elements. The bridge 208 may be powered by using a driver circuit 231, and the bridge 210 may be powered by using a driver circuit 233. Specifically, the driver circuit 231 may be configured to supply a driving voltage VTMR1 to the bridge 208, and the driver circuit 233 may be configured to provide a driving voltage VTMR2 to the bridge 210. The driving voltage VTMR1 and the driving voltage VTMR2 may be different from one another. Specifically, the level of the driving voltage VTMR1 may be set by the driver circuit 231 in accordance with a first trim value that is stored in a programmable memory 235; and the level of the driving voltage VTMR2 may be set by the driver circuit 233 based on a second trim value that is stored in a programmable memory 237. In some implementations, the first trim value and the second trim value may be static values, which do not change during the operation of the sensor 110. Alternatively, in some implementations, any of the first trim value and the second trim value may be determined dynamically by the processing circuitry 240 to compensate for sensitivity drifts that are the result of variations in temperature. In the latter implementations, the first and second trim values may be stored in the memories 235 and 237, respectively, by the processing circuitry 240, as indicated by the dashed arrows in FIG. 2.

Although the programmable memory 235 and the programmable memory 237 are depicted as discrete entities in FIG. 2, it will be understood that in some implementations, the programmable memory 235 and the programmable memory 237 may be part of the same memory module. According to the present example, the driver circuit 231 and the driver circuit 233 are collectively referred to as "driver circuitry." Although in the example of FIG. 2 driver circuit 231 and driver circuit 233 are separate entities, alternative implementations are possible in which the driver circuit 231 and the driver circuit 233 are at least partially integrated with one another.

In operation, the bridge 208 may output a differential signal, which is subsequently amplified by an amplifier 209 and demodulated by demodulator 224, at frequency f (e.g., the frequency of the coil driver 222) to produce a signal V1. Signal V1 may be digitized by analog-to-digital-converter 228 and provided to the processing circuitry 240. Similarly, the bridge 210 may generate a differential signal, which is subsequently amplified by an amplifier 211 and demodulated by, at frequency f, by demodulator 226 to produce a signal V2. Signal V2 may be digitized by ADC 230 and provided to the processing circuitry 240. As is further discussed below, the processing circuitry 240 may process signals V1 and V2 to generate signal P, which identifies the position of the target 120, relative to the sensor 110.

As illustrated, the processing circuitry 240 may implement a filtering logic 241, a processing logic 242, an offset logic 243, and a segmented linearization logic 245. The filtering logic 241 may implement any suitable type of digital filter, such as a low-pass filter, for example. The calculation logic may be configured to calculate the position P of the target 120 relative to the sensor 110. Depending on the physical configuration of the sensor 110, the position P may be generated in accordance with Equation 1 below or in accordance with Equation 16, both of which are discussed further below. The offset logic 243 may be configured to adjust the position P based on a signal from a temperature sensor 131 to produce an adjusted position P'. The segmented linearization logic 245 may linearize the position P' to produce a linearized position P" in a well-known fashion. The linearized position P" may be subsequently output from the sensor 110 for use by other electronic components or devices that are electrically coupled to the sensor 110.

According to the present disclosure, the sensor 110 may be resistant (or ideally immune) to the effects of stray magnetic fields that are incident on the sensor 110. This stray field resistance is achieved by driving the MR bridge 208 and the bridge 210 with different driving voltages (i.e., voltages VTMR1 and VTMR2, respectively). As is discussed further below, the values of voltages VTMR1 and VTRM2 may be selected to cause signals V1 and V2 (and/or the bridge 208 and bridge 210) to have the same drift when exposed to a stray magnetic field. When the bridge 208 and bridge 210 have the same drift in response to a stray magnetic field, the calculation of the position P (of the target 120 relative to the sensor 110) may remain unaffected by the presence of the stray magnetic field, as the effects of the stray magnetic field on signals V1 and V2 would cancel each other out when the position P of the target 120 is calculated.

Figure 3:
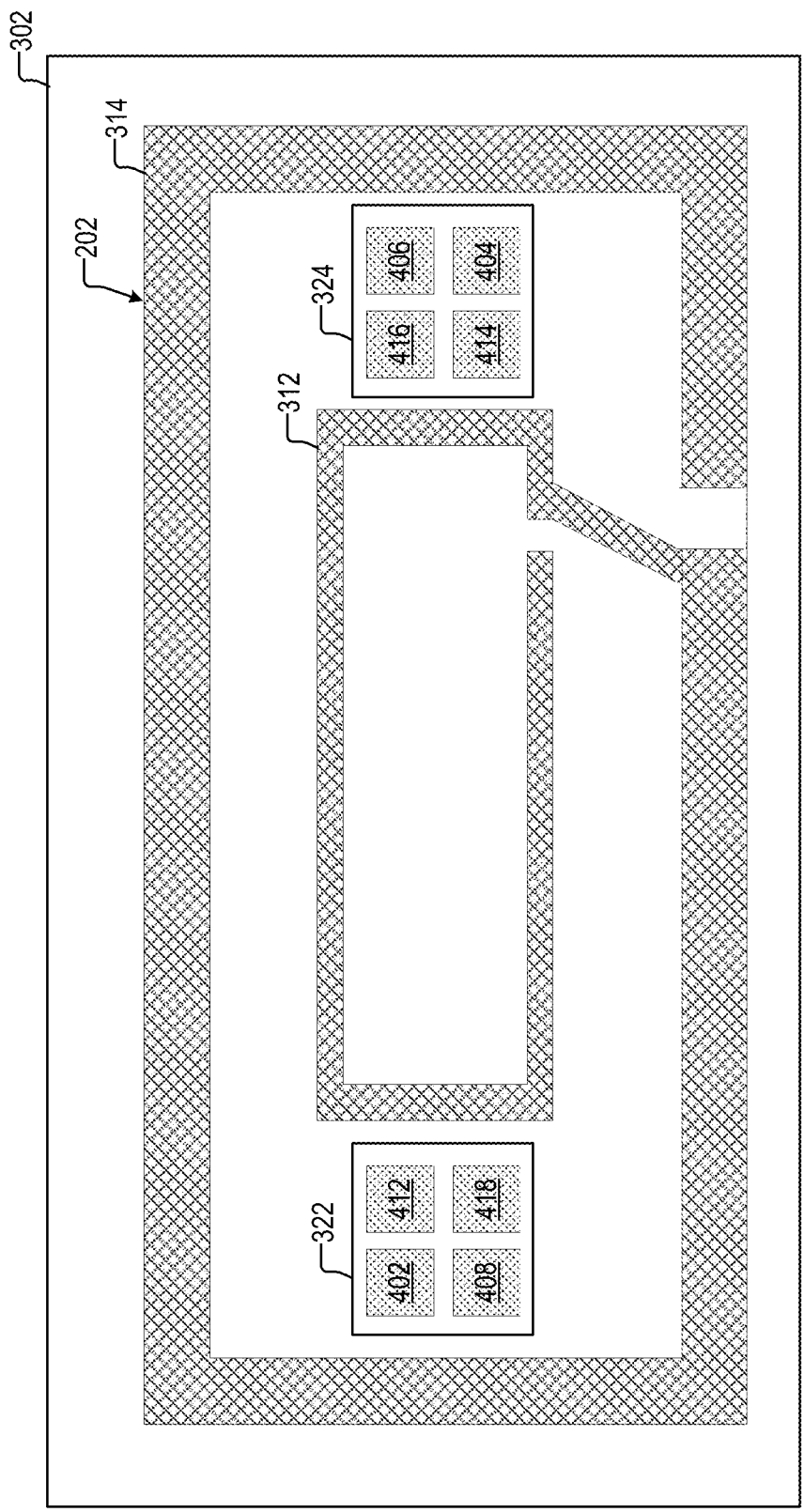
FIG. 3 is a schematic diagram illustrating one implementation of the sensor of FIG. 2, according to aspects of the disclosure.
Figure 4A:
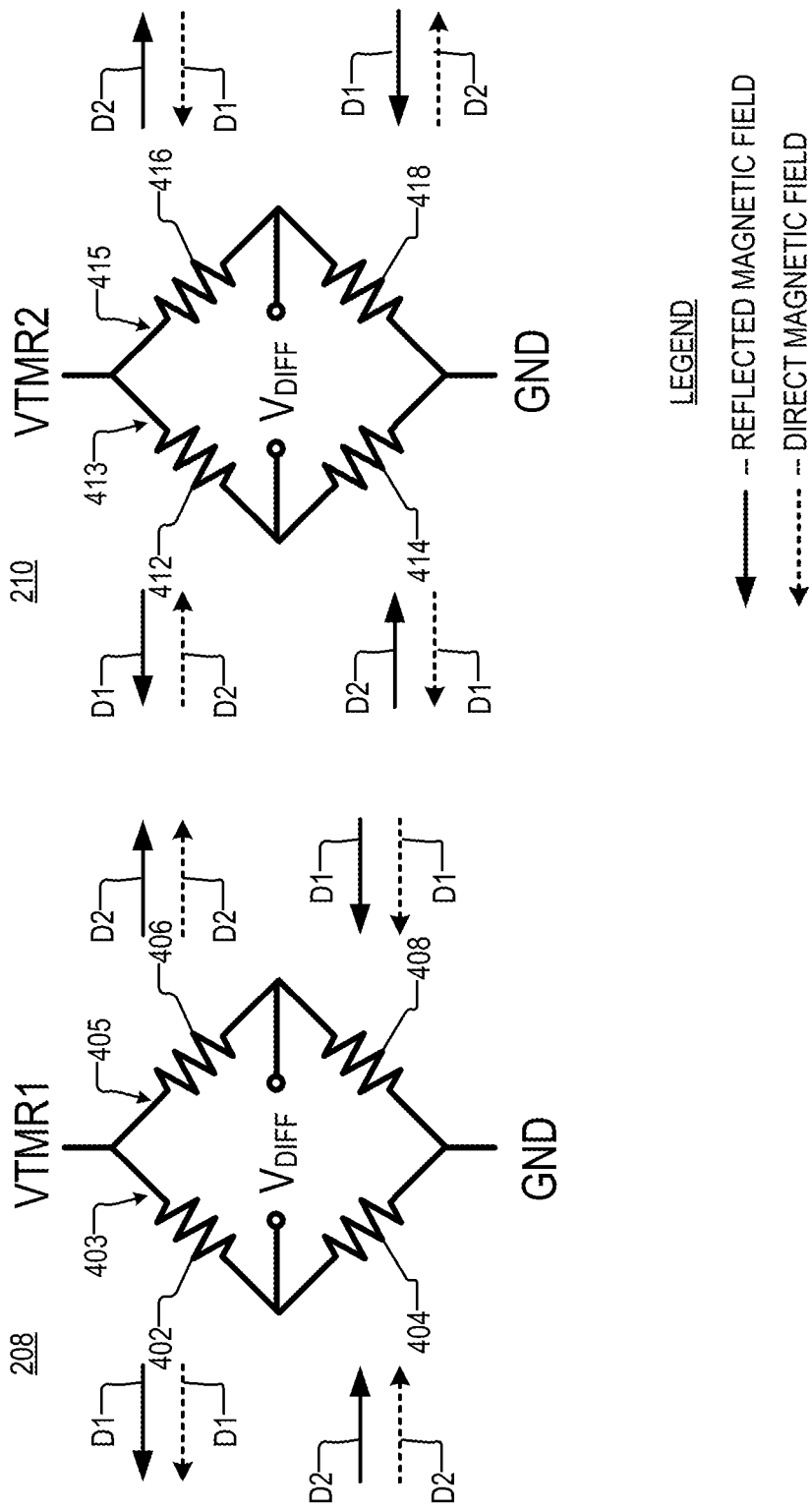
FIG. 4A is a circuit diagram showing examples of MR bridges that are part of the sensor of FIG. 2, according to aspects of the disclosure.

FIGS. 3-4A show the sensor 110 in a first physical configuration. As illustrated, the coil 202 may include a first coil turn 312 and a second coil turn 314. The coil 202 may be implemented as a conductive trace, and it may be formed on the substrate 302 together with the bridge 208 and bridge 210. The elements of the bridge 208 and bridge 210 may be formed in regions 322 and 324 of the substrate 302, as shown. The regions 322 and 324 may be situated on opposite sides of the first coil turn 312.

The MR bridge 208 may include a first branch 403 and a second branch 405. The first branch 403 may include an MR element 402 that is coupled to an MR element 404, which is coupled to a voltage source VTMR1 via MR element 402, and MR element 402 is coupled to ground via MR element 404. The second branch 405 may include an MR element 406 that is coupled to an MR element 408, which is coupled to a voltage source VMTR1 via MR element 406, and MR element 406 is coupled to ground via MR element 408. In some implementations, any of the MR-elements 402-408 may include one or more of a Hall effect element, a giant magnetoresistance (GMR) element, a tunnel magnetoresistance (TMR) element, an anisotropic magnetoresistance (AMR) element, a magnetic tunnel junction (MTJ) element, and/or any other suitable type of MR element. Any of the MR elements 402-408 may include a single MR element or multiple MR elements.

The MR bridge 210 may include a first branch 413 and a second branch 415. The first branch 413 may include an MR element 412 that is coupled to an MR element 414, which is coupled to a voltage source VTMR2 via MR element 412, and MR element 412 is coupled to ground via MR element 414. The second branch 415 may include an MR element 416 that is coupled to an MR element 418, which is coupled to a voltage source VMTR2 via MR element, and MR element 416 is coupled to ground via MR element 418. In some implementations, any of the MR-elements 412-418 may include one or more of a Hall effect element, a giant magnetoresistance (GMR) element, a tunnel magnetoresistance (TMR) element, an anisotropic magnetoresistance (AMR) element, a magnetic tunnel junction (MTJ) element, and/or any other suitable type of MR element. Any of the MR elements 402-408 may include a single MR element or multiple MR elements.

Each of branches 403, 405, 413, and 415 may have one of its MR elements formed in one of regions 322, 324, and the other one of its MR elements formed in the other one of regions 322, 324. Regarding branch 403, MR element 402 may be formed in region 322, and MR element 404 may be formed in region 324. Regarding branch 405, MR element 408 may be formed in region 322, and MR element 406 may be formed in region 324. Regarding branch 413, MR element 412 may be formed in region 322, and MR element 414 may be formed in region 324. Regarding branch 415, MR element 418 may be formed in region 322, and MR element 416 may be formed in region 324.

The physical positioning of MR elements 402-408 and MR elements 412-418 on the substrate 302 may result in the magnetic fields 112 and 122 having the following directions at each of MR elements 402-408 and MR elements 412-418. At MR element 402, the direct magnetic field 112 and the reflected magnetic field 122 may both have direction D1. At MR element 404, the direct magnetic field 112 and the reflected magnetic field 122 may both have direction D2. At MR element 406, the direct magnetic field 112 and the reflected magnetic field 122 may both have direction D2. At MR element 408, the direct magnetic field 112 and the reflected magnetic field 122 may both have direction D1. At MR element 412, the direct magnetic field 112 may have a direction D2, and the reflected magnetic field 122 may have a direction D1. At MR element 414, the direct magnetic field 112 may have a direction D1, and the reflected magnetic field 122 may have a direction D2. At MR element 416, the direct magnetic field 112 may have a direction D1, and the reflected magnetic field 122 may have a direction D2. At MR element 418, the direct magnetic field 112 may have a direction D2, and the reflected magnetic field 122 may have a direction D1. According to the present example, directions D1 and D2 are substantially opposite to one another.

According to aspects of the disclosure, when the sensor 110 is arranged in accordance with the first physical configuration (shown in FIGS. 3-4B), the position P of the target 120 may be calculated in accordance with Equation 1 below:

$$P = \frac{V_1 + V_2}{V_1 - V_2}, \quad \text{(Eq. 1)}$$

where P is the position of the target relative to the sensor 110, $V_1$ is the signal produced by the bridge 208, and V2 is the signal produced by the bridge 210.

As noted above, the presence of stray magnetic fields can reduce the accuracy at which the position P is calculated when signals V1 and V2 exhibit a different drift in response to a stray magnetic field. As is discussed further below, driving the bridges 208 and 210 with different voltages (e.g., voltages VTMR1 and VTMR2) can equalize the rates at which signals V1 and V2 drift in the presence of a stray magnetic field, thus improving the accuracy at which the position P can be calculated in the presence of a stray magnetic field. Further discussion of the rates at which signals V1 and V2 drift in the presence of a stray magnetic field is discussed further below with respect to FIG. 4B.

Figure 4B:
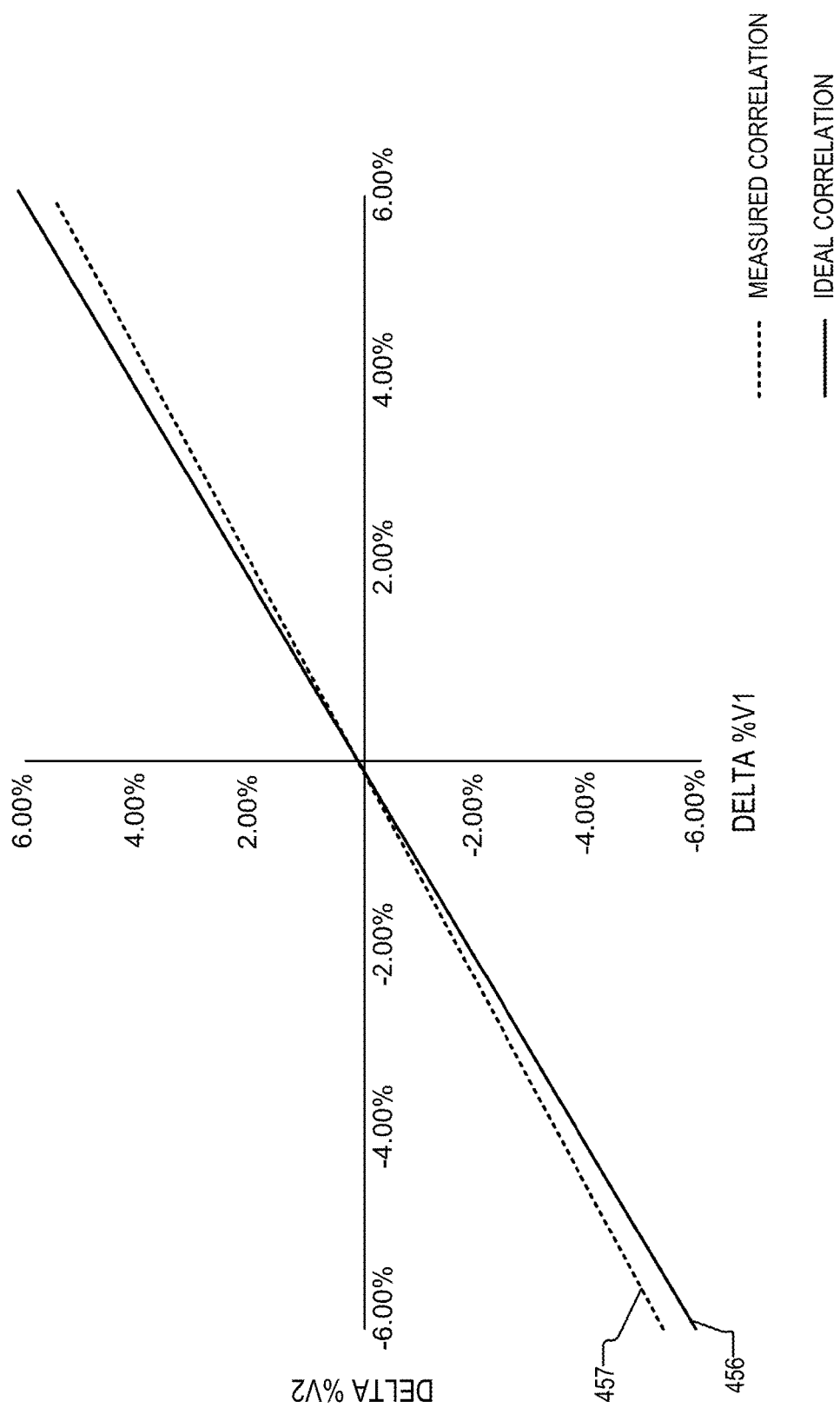
FIG. 4B is a graph showing respective sensitivity curves for the MR bridges of FIG. 4A, according to aspects of the disclosure.

According to the present disclosure, it has been observed that there is an approximately linear correlation between the changes in signals V1 and V2 that take place when the sensor 110 is exposed to a stray magnetic field. Shown in FIG. 4B is a curve 456, which represents an ideal correlation between the changes in signals V1 and V2 when the sensor 110 is exposed to a stray magnetic field of varying strength. As illustrated, when the correlation is ideal, signal V1 and signal V2 will change by the same amount in response to the same magnetic field. Further shown in FIG. 4B is a curve 457, which represents a measured correlation between the changes in signals V1 and V2 when the sensor 110 is exposed to a stray magnetic field of varying strength. Curve 457 represents the correlation between signals V1 and V2 when MR bridges 208 and 210 are driven with the same driving voltage. As illustrated, when the correlation is less-than-ideal, signals V1 and V2 will change by different amounts in response to the same stray magnetic field. In other words, when the correlation is less-than-ideal, signals V1 and V2 may drift differently in response to the same stray magnetic field.

According to the present disclosure, it has been observed that, because both curves 456 and 457 are very close to a linear curve, it is possible to equalize the drifts exhibited in signals V1 and V2 when the bridges 208 and 210 exposed to the same magnetic field. The drifts may be equalized by causing the stray-field sensitivities of bridges 208 and 210 to match. The stray-field sensitivities of bridges 208 and 210 may be caused to match by driving the bridges 208 and 210 with voltages VTMR1 and VTMR2, which are selected to compensate for physical and/or operational differences between the bridges 208 and 210 that cause them to have differing stray-field sensitivities. Such differences can be modeled by using proportionality constants T1, T2, and coupling coefficients K1 and K2, which are discussed further below with respect to Equations 2-13. An example of a method for selecting the voltages VTMR1 and VTMR2 is discussed further below with respect to Equation 13. When the stray-field sensitivities of bridges 208 and 210 match, the accuracy of the target position calculation that is performed by the calculation logic 242 (see FIG. 2) is unlikely (or less likely) to be affected negatively by the presence of stray magnetic fields, resulting in the sensor 110 being resistant (or ideally immune) to the effects of stray magnetic fields.

As noted above, signals V1 and V2 may drift differently in response to the same magnetic field when MR bridges 208 and 210 have different stray-field sensitivities. The stray-field sensitivities of bridges 208 and 210 can be modeled as follows.

$$\frac{dMR_{1SF}}{dSF} = T_1 f(S_1') \cdot SF \quad \text{(Eq. 2)}$$

$$\frac{dMR_{2SF}}{dSF} = T_2 f(S_2') \cdot SF \quad \text{(Eq. 3)}$$

$$S_1' = MR \cdot VTMR1 \cdot (1+\Delta MR) \quad \text{(Eq. 4)}$$

$$S_2' = q \cdot MR \cdot VTMR2 \cdot (1-\Delta MR) \quad \text{(Eq. 5)}$$

$$q = \frac{K1}{K2}, \quad \text{(Eq. 6)}$$

where (A) $dMR_{1SF}$ is change in the magnetoresistance of bridge 208 in response to a stray magnetic field (e.g., magnetoresistance drift of MR bridge 208 in response to a stray magnetic field), (B) $dMR_{2SF}$ is change in the magnetoresistance of bridge 208 in response to a stray magnetic field (e.g., magnetoresistance drift of the bridge 210 in response to a stray magnetic field), (C) $f(S_1')$ is the gauss-to-voltage sensitivity of bridge 208 when no stray magnetic fields are indicent on the bridge 208, (D) $f(S_2')$ is the gauss-to-voltage sensitivity of bridge 210 when no stray magnetic fields are incident on the bridge 210, (E) $T_1$ is a scalar value (e.g., a proportionality constant), (F) $T_2$ is a scalar value (e.g., a proportionality constant) that is different from $T_1$, (G) VTMR1 is the driving voltage of bridge 208, (H) VTMR2 is the driving voltage of the bridge 210, (I) K1 is a coupling coefficient of the bridge 208, and (J) K2 is a coupling coefficient of the bridge 210, (K) dSF is the change in magnetic flux density of a stray magnetic field, and (L) and ΔMR is magnetoresistance mismatch between the bridge 208 and the bridge 210. In some implementations, the coupling coefficient K1 may be based on the amount of G/mA flowing in the coil 202 that the bridge 208 sees and the coupling coefficient K2 may be based on the amount of G/mA flowing in the coil 202 that the bridge 210 sees. The values of the coupling coefficients K1 and K2 may be measured in G/m. The difference in the values of the coupling coefficients K1 and K2 may be attributed to variations in the geometry of the coil 202, which fall within manufacturing tolerances. For example, if the thickness of the coil 202 changes slightly in parts of the coil 202 that are closer to one of the bridges 208 and 210 (than to the other), this may lead to the coupling coefficient K1 being different from the coupling coefficient K2, etc.

According to the present disclosure, the function $$\frac{dMR_{1SF}}{dsF}$$

represents the change in magnetoresistance of the bridge 208 per unit change in the magnetic flux density of a stray magnetic field that is incident on the bridge 208 (and/or sensor 110), and it indicates that the sensitivity of the bridge 208 is non-linear with respect to a given applied magnetic field. Similarly, the function $$\frac{dMR_{1SF}}{dsF}$$

represents the change in magnetoresistance of the bridge 210 per unit change in the magnetic flux density of a stray magnetic field that is incident on the bridge 210 (and/or sensor 110), and it indicates that the sensitivity of the bridge is non-linear with respect to any applied magnetic field. In general, the sensitivity of any given MR bridge can be expressed by the equation of S=(MR*VTMR)/2*Bmax), where S is the sensitivity of the given MR bridge, VTMR is driving voltage of the given MR bridge, and Bmax is the value of an applied magnetic field that defines a linear range of the transfer function of the given MR bridge.

When the stray-field sensitivity (and/or magnetic field sensitivity) of the bridge 208 is made to match the stray-field sensitivity (and/or magnetic field sensitivity) of the bridge 210, signals V1 and V2 may drift by the same amount in response to the same stray magnetic field, in which case they are said to be ideally-correlated (or close-to-ideally correlated). When signals V1 and V2 are ideally-correlated (or close-to-ideally-correlated) the incidence of a stray magnetic field on the sensor 110 is unlikely to have any negative effect on the accuracy of the sensor 110 as any changes that are imparted on the values of signals V1 and V2 would cancel each other out in the calculation of the position P of target 120 (shown in FIG. 1).

In some implementations, the bridge 208 and bridge 210 may have matching stray-field sensitivities when Equation 7 holds true.

$$T_1 f(S_1') \cdot SF = T_2 f(S_2') \cdot SF \quad \text{(Eq. 7)}$$

Equation 7 would hold true when the values of $f(S_1')$ and $f(S_2')$ offset any differences between proportionality constants T1 and T2. Oftentimes, the proportionality constants T1 and T2 can be expected to be different from one another due to manufacturing tolerances associated with the production of the MR bridge 208 and the MR bridge 210. The values of $f(S_1')$ and $f(S_2')$ may offset any differences between $T_1$ and $T_2$ when the following relationship is satisfied: $T_1/T_2 = f(S_2')/f(S_1')$. The relationship may be satisfied when the values of the driving voltages VTMR1 and VTMR2 are selected in accordance with Equation 13 below. When the values of the driving voltages VTMR1 and VTMR2 are selected in accordance with Equation 13 below, the relationship will be satisfied, resulting in the bridge 208 and bridge 210 having matching stray-field sensitivities.

A methodology is now described for selecting values for driving voltages VTMR1 and VTMR2 that satisfy the above relationship and render the sensor 110 resistant (or ideally immune) to the effects of stray magnetic fields. Consider first that in the absence of stray magnetic fields, signals V1 and V2 (which are output from bridges 208 and 210, respectively, may have the same absolute value:

$$V1 = -V2 \quad \text{(Eq. 8)}$$

When the same voltage is used to drive both bridge 208 and bridge 210, the values of signals V1 and V2 can be expressed as follows when no stray fields are present:

$$\begin{cases} V1(T, B_S, x) = I(T) \cdot K_1 \cdot MR \cdot VTMR \cdot (1 + \Delta MR) \cdot (1 + \Delta MR_{1SF}) \cdot [1 + r(x)] \\ V2(T, B_S, x) = I(T) \cdot K_1 \cdot MR \cdot VTMR \cdot (1 - \Delta MR) \cdot (1 + \Delta MR_{2SF}) \cdot [q + r(x)] \end{cases} \quad \text{(Eq. 9)}$$

$$r(x) = \frac{RF}{DCF}, \quad \text{(Eq. 10)}$$

where RF is the reflected field 122 from the target, DCF is the local field created by the coil 202 around each of the bridges 208 and 210, and that is independent of the target's position and proportional to the DMF 112, Bs is a stray magnetic field, r(x) is magnetic field reflection coefficient, and x is the target's 120 position or distance with respect to the magnetic sensor 110.

When different voltages are used to drive bridges 208 and 210 (i.e., voltages VTMR1 and VTMR2), Equation 9 can be rewritten as follows:

$$\begin{cases} V1(T, B_S, x) = I(T) \cdot K_1 \cdot MR \cdot VTMR1 \cdot (1 + \Delta MR) \cdot (1 + \Delta MR_{1SF}) \cdot [1 + r(x)] \\ V2(T, B_S, x) = I(T) \cdot K_1 \cdot MR \cdot VTMR2 \cdot (1 - \Delta MR) \cdot (1 + \Delta MR_{2SF}) \cdot [q + r(x)] \end{cases} \quad \text{(Eq. 11)}$$

Based on Equation 11, Equation 8 can be rewritten as follows:

$$VTMR1 \cdot (1 + \Delta MR) = -VTMR2 \cdot (1 - \Delta MR) \cdot q \quad \text{(Eq. 12)}$$

Equation. 12 can then be simplified to Equation 13 below:

$$VTMR1 = -VTMR2 \cdot q \cdot \frac{(1 - \Delta MR)}{(1 + \Delta MR)} \quad \text{(Eq. 13)}$$

According to the present disclosure, when the bridges 208 and 210 are driven with voltages VTMR1 and VTMR2, respectively, that conform to the relationship specified by Equation 13, the sensor 110 would be resistant (or ideally immune) to the effects of stray fields that are incident on the sensor 110. In some respects, setting the values of voltages VTMR1 and VTMR2 would cause bridges 208 and 210 to have the same (or matching) sensitivities, as well as the same (or matching) stray-field sensitivities.

As noted above, coil-activated position sensors use an on-chip (or chip-adjacent) coil to emit a direct magnetic field, and MR bridges to measure a reflected magnetic field that is induced in a target by the direct magnetic field. Measurements of the reflected magnetic field that are captured with the MR bridges are used to calculate the position of the target. The MR bridges in a conventional coil-activated position sensor often have different sensitivities, and this difference is mitigated by performing a position calculation that takes into account that the MR bridges have different sensitivities. In the absence of stray magnetic fields, the position calculation may produce accurate results because: (i) the direct magnetic field (emitted by the on-chip or chip-adjacent coil) is highly predictable in nature, and (ii) the sensitivity curves of the MR bridges can be discovered beforehand (e.g., see FIG. 4B). However, due to the unpredictability of stray magnetic fields, it is hard to derive a model that produces highly accurate position calculations without the use of additional hardware and/or a large increase in complexity. In this regard, matching the sensitivities of the MR bridges in a coil-activated position sensor (e.g., by driving the MR bridges with different driving voltages) provides an efficient approach for increasing the accuracy of coil-activated position sensors in the presence of stray magnetic fields, which does not require the use of additional hardware and can be accomplished without a large increase in production cost.

In some implementations, selecting the driving voltages VTMR1 and VTMR2 in accordance with Equation 13 may carry the added benefit of simplifying the position calculation(s) that need to be performed by the calculation logic 242 (see FIG. 2). If the bridges 208 and 210 are driven with the same driving voltage, the position P of the target 120 may be calculated in accordance with Equation 14 below:

$$P = \frac{(1 + \Delta MR_{1SF}) \cdot [1 + r(x)] + (1 + \Delta MR_{2SF}) \cdot [q + r(x)]}{(1 + \Delta MR_{1SF}) \cdot [1 + r(x)] - (1 + \Delta MR_{2SF}) \cdot [q + r(x)]} \quad \text{(Eq. 14)}$$

When the driving voltages VTMR1 and VTRM2 have the relationship specified by Equation 13, bridges 208 and 210 may have the same sensitivity. When bridges 208 and 210 have the same sensitivity, $\Delta MR_{1SF} = \Delta MR_{2SF}$, and Equation 14 can be simplified as follows:

$$P = \frac{-q \cdot [1 + r(x)] + [q + r(x)]}{-q \cdot [1 + r(x)] - [q + r(x)]} = \frac{r(x) \cdot (1 - q)}{-2q - r(x) \cdot (1 + q)} \quad \text{(Eq. 15)}$$

In other words, setting the driving voltages VTMR1 and VTMR2 (of the bridges 208 and 210, respectively) in accordance with Equation 13 has the added benefit of simplifying the calculation of the position P of the target 120.

Figure 5:
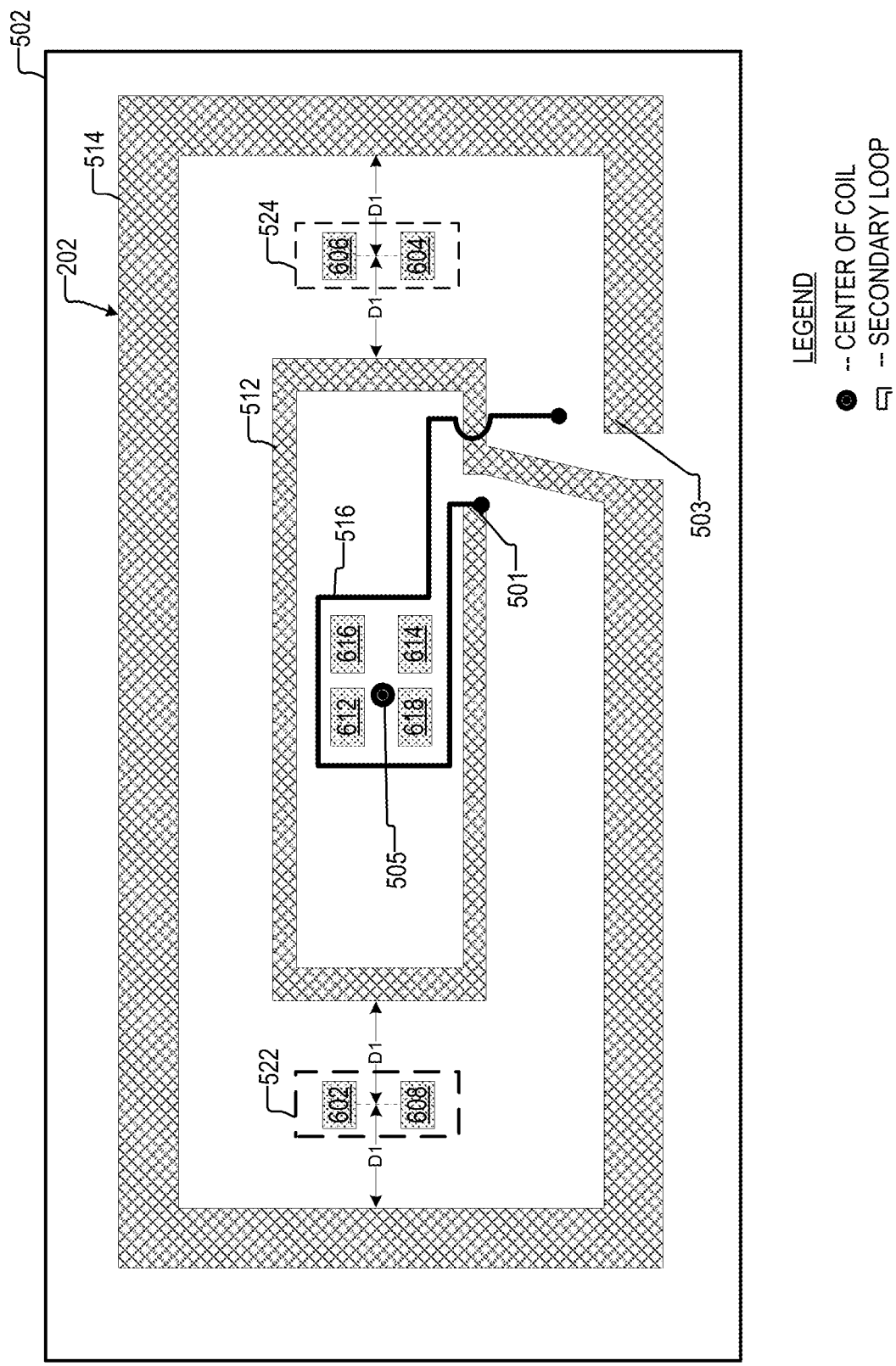
FIG. 5 is a schematic diagram illustrating another implementation of the sensor of FIG. 2, according to aspects of the disclosure.
Figure 6:
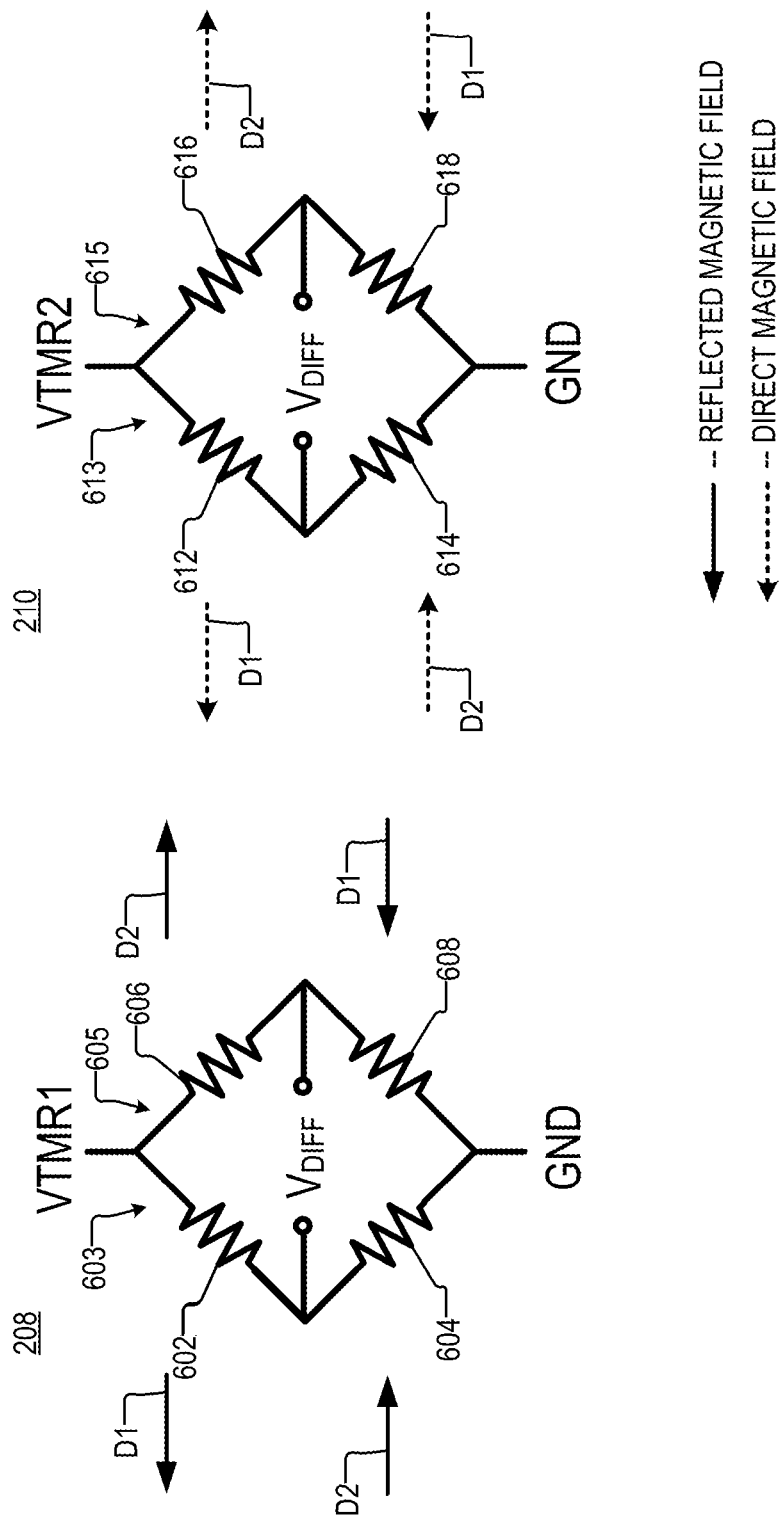
FIG. 6 is a circuit diagram showing examples of MR bridges that are part of the sensor of FIG. 2, according to aspects of the disclosure.

FIGS. 5-6 show the sensor 110 in a second physical configuration. According to the second physical configuration, the coil 202 may be formed of a conductive trace having a first end 501 and a second end 503, which is arranged to define a first coil turn 512 and a second coil turn 514. Furthermore, a secondary loop 516 may be coupled to the first end 501, as shown. The secondary loop 516 may be formed in a central portion of the coil turn 512, and it may be arranged to surround the elements of the bridge 210. The coil 202 and the secondary loop 516 may be formed on a substrate 502. The elements of the bridge 208 and bridge 210 may also be formed on the substrate 502. According to the present example, coil 202 and the secondary loop 516 are formed by the same conductive trace and have the same thickness. However, in some implementations, the thickness (e.g., cross-sectional area) of the secondary loop 516 may be smaller than the thickness of the conductive trace that is used to form the coil 202. According to the example of FIG. 5, the coil 202 and the secondary loop 516 are coupled in series. Coupling the coil 202 and the secondary loop 516 in series is advantageous because it allows the same current to flow across the coil 202 and the secondary loop 516, which makes it easier to achieve same (or similar) coupling coefficients K1 and K2 for the bridge 208 and the bridge 210, respectively. However, alternative implementations are possible when the coil 202 and the secondary loop 516 are coupled in parallel. In such implementations, the coupling coefficients K1 and K2 are more likely to be different from one another.

The bridge 208 may include a first branch 603 and a second branch 605. The first branch 603 may include an MR element 602 that is coupled to an MR element 604, which is coupled to a voltage source VTMR1 via MR element 602, and MR element 602 is coupled to ground via MR element 604. The second branch 605 may include an MR element 606 that is coupled to an MR element 608, which is coupled to a voltage source VTMR1 via MR element 606, and MR element 606 is coupled to ground via MR element 608.

The bridge 210 may include a first branch 613 and a second branch 615. The first branch 613 may include an MR element 612 that is coupled to an MR element 614, which is coupled to a voltage source VMTR2 via MR element 612, and MR element 612 is coupled to ground via MR element 614. The second branch 615 may include an MR element 616 that is coupled to an MR element 618, which is coupled to a voltage source VTMR2 via MR element 616, and MR element 616 is coupled to ground via MR element 618.

The positioning of MR elements 602-608 and MR elements 612-618 on the substrate 502 is now described in further detail. The bridge 210 may be formed at the center 505 of the coil turn 512, such that each of the elements 612-614, which form the bridge 210, is situated at the same distance from the center 505 of the coil turn 512. Furthermore, the secondary loop 516 may be arranged such that each of the MR elements 612-614 is separated by the same distance from the secondary loop.

The bridge 208 may be formed on opposite sides of the coil turn 512. More particularly, MR elements 602 and 608 may be formed on one side of the coil turn 512, and MR elements 606 and 604 may be formed on the opposite side of the coil turn 512. Or put differently, MR elements 602 and 608 may be formed in a region 522 of the substrate 502, and elements 606 and 604 may be formed in a region 524 of the substrate 502. Each of the MR elements 602-608 may be spaced apart by the same distance D1 from the coil turns 512 and 514.

Because the bridge 210 is positioned at the center of the coil turn 512, different components of the direct magnetic field 112 and the reflected magnetic field 122 may cancel each other out, causing the magnetoresistance of MR elements 612-618 to be unaffected by the direct magnetic field 112 and the reflected magnetic field 122. However, the magnetoresistance of the MR elements 612-618 would be affected by the magnetic field, which is generated by the secondary loop 516. Because the secondary loop 516 is coupled to the coil 202, the magnetic field generated by the secondary loop 516 would be proportional to the direct magnetic field, and it can be used as a proxy for the direct magnetic field 112.

When the sensor 110 is configured in accordance with the second physical configuration (shown in FIGS. 5-6), signal V1 (generated by bridge 208) senses only the reflected magnetic field 122, whereas signal V2 (generated by bridge 210) senses only the direct magnetic field 112 (by proxy of the magnetic field generated by the secondary loop 516). As illustrated in FIG. 6, at MR elements 602 and 608 (of bridge 208), the reflected magnetic field may have a direction D1. At MR elements 604 and 606 (of bridge 208), the reflected magnetic field may have a direction D2. At MR elements 612 and 618 (of bridge 210), the direct magnetic field may have a direction D1. And at MR elements 614 and 616 (of bridge 210), the direct magnetic field may have a direction D2.

In this regard, when the sensor 110 is configured in accordance with the second physical configuration (shown in FIGS. 5-6), the position of the target 120 relative to the sensor 110 can be determined as follows:

$$P = \frac{V1}{V2} \tag{Eq. 16}$$

Furthermore, when the sensor 110 is configured in accordance with the second configuration (shown in FIGS. 5-6), signals V1 and V2 can be expressed as follows:

$$\begin{cases} V1(T, B_S, x) = I(T) \cdot K_1 \cdot MR \cdot VTMR_1 \cdot (1 + \Delta MR) \cdot (1 + \Delta MR_{1SF}) \cdot [1 + r(x)] \\ V2(T, B_S, x) = I(T) \cdot K_1 \cdot MR \cdot VTMR_2 \cdot (1 - \Delta MR) \cdot (1 + \Delta MR_{2SF}) \cdot q \end{cases} \tag{Eq. 17}$$

Accordingly, Eq. 16 can be rewritten as follows:

$$P = \frac{(1 + T \cdot SF) \cdot [1 + r(x)]}{(1 + T \cdot SF) \cdot q} = \frac{1 + r(x)}{q} \tag{Eq. 18}$$

As can be readily appreciated, Equation 18 involves fewer calculations than equation 15. Accordingly, configuring the sensor 110 in accordance with the second physical configuration (shown in FIGS. 5-6) can simplify the calculation of the position P (of the target 120) in comparison to when the first physical configuration (shown in FIGS. 3-4A) and/or Equation 15 are used.

Notably, Equations 17-18 are valid when coil 202 is coupled in series with the secondary coil 516. When the coil 202 and the secondary coil 516 are coupled in parallel to one another, equation 18 may need to be multiplied by the ratio of the coupling coefficients of bridge 208 and bridge 210 in order to yield the position P (of the target 120), as illustrated by Equations 19 and 20 below:

$$\begin{cases} V1(T, B_S, x) = I(T) \cdot K_1 \cdot MR \cdot VTMR_1 \cdot (1 + \Delta MR) \cdot (1 + \Delta MR_{1SF}) \cdot [1 + r(x)] \\ V2(T, B_S, x) = I(T) \cdot K_2 \cdot MR \cdot VTMR_2 \cdot (1 - \Delta MR) \cdot (1 + \Delta MR_{2SF}) \cdot q \end{cases} \tag{Eq. 19}$$

$$P = \frac{1+r(x)}{q}\left(\frac{K1}{K2}\right) \quad\quad \text{(Eq. 20)}$$

FIGS. 1-6 are provided as an example only. Reference herein to "one embodiment" or "an embodiment" means that a particular feature, structure, or characteristic described in connection with the embodiment can be included in at least one embodiment of the claimed subject matter. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used throughout the disclosure, the term approximately shall be interpreted as "within 15%."

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing and claiming the invention and are not intended to limit the claims in any way. Such terms do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations, the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the described embodiments are not so limited. As would be apparent to one skilled in the art, various functions of circuit elements may also be implemented as processing blocks in a software program. Such software may be employed in, for example, a digital signal processor, micro-controller, or general-purpose computer.

Some embodiments might be implemented in the form of methods and apparatuses for practicing those methods. Described embodiments might also be implemented in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a general-purpose processor, the program code segments combine with the processor to provide a unique device that operates analogously to specific logic circuits. Described embodiments might also be implemented in the form of a bitstream or other sequence of signal values electrically or optically transmitted through a medium, stored magnetic-field variations in a magnetic recording medium, etc., generated using a method and/or an apparatus of the claimed invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However, and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

It will be further understood that various changes in the details, materials, and arrangements of the parts which have been described and illustrated in order to explain the nature of the claimed invention might be made by those skilled in the art without departing from the scope of the following claims.

The invention claimed is:

1. A sensor comprising:
   a first magnetoresistive (MR) bridge having a first stray field sensitivity;
   a second MR bridge having a second stray field sensitivity; and
   a driver circuitry configured to: (i) supply a first voltage to the first MR bridge, and (ii) supply a second voltage to the second MR bridge that is different from the first voltage, wherein supplying the first voltage and the second voltage to the first MR bridge and the second MR bridge, respectively, causes the first stray field sensitivity to match the second stray field sensitivity.

2. The sensor of claim 1, wherein the first voltage is based on: (i) the second voltage and (ii) a ratio between a first coupling factor associated with the first MR bridge and a second coupling factor associated with the second MR bridge.

3. The sensor of claim 1, wherein the second voltage is based on a magnetoresistance mismatch that is associated with the first MR bridge and the second MR bridge.

4. The sensor of claim 1, wherein the first voltage is determined according to an equation of:

$$VTMR_1 = -VTMR_2 \cdot q \cdot \frac{(1-\Delta MR)}{(1+\Delta MR)},$$

where $VTMR_1$ is the first voltage, $VTMR_2$ is the second voltage, q is a ratio between a first coupling factor associated with the first MR bridge and a second coupling factor associated with the second MR bridge, and $\Delta MR$ is a magnetoresistance mismatch associated with the first MR bridge and the second MR bridge.

5. The sensor of claim 1, further comprising a coil formed on a substrate, the coil having a first coil turn and a second coil turn that is disposed outside of the first coil turn, wherein:
   the first MR bridge includes a plurality of MR elements formed in a first region of the substrate and a second region of the substrate, the first region and the second region being located between the first turn and the second coil turn, and the first region and the second region being located on opposite sides of the first turn, and
   the second MR bridge includes a plurality of second MR elements formed in the first region of the substrate and the second region of the substrate.

6. The sensor of claim 1, further comprising a coil, wherein:
   the coil includes a first coil turn and a second coil turn that is disposed outside of the first coil turn, and the coil is coupled to a secondary loop that is formed inside the first turn;
   the first MR bridge includes a first plurality of MR elements that are formed between the first coil turn and the second coil turn;
   the second MR bridge includes a second plurality of MR elements that are formed inside the first coil turn and inside the secondary loop.

7. The sensor of claim 6, wherein the second MR bridge is centered with the first coil turn.

8. A method for use in a sensor having a first MR bridge and a second MR bridge that are operatively coupled to a processing circuitry, the method comprising:
   driving the first MR bridge with a first voltage, the first MR bridge having a first stray field sensitivity;
   driving the second MR bridge with a second voltage, the second MR bridge having a second stray field sensitivity; and
   calculating, by the processing circuitry, a position of a target based on a first signal that is provided by the first MR bridge and a second signal that is provided by the second MR bridge,
   wherein supplying the first voltage and the second voltage to the first MR bridge and the second MR bridge, respectively, causes the first stray field sensitivity to match the second stray field sensitivity.

9. The method of claim 8, wherein the first voltage is based on: (i) the second voltage and (ii) a ratio between a first coupling factor associated with the first MR bridge and a second coupling factor associated with the second MR bridge.

10. The method of claim 8, wherein the second voltage is based on a magnetoresistance mismatch that is associated with the first MR bridge and the second MR bridge.

11. The method of claim 8, wherein the first voltage is determined according to an equation of:

$$VTMR_1 = -VTMR_2 \cdot q \cdot \frac{(1-\Delta MR)}{(1+\Delta MR)},$$

where $VTMR_1$ is the first voltage, $VTMR_2$ is the second voltage, q is a ratio between a first coupling factor associated with the first MR bridge and a second coupling factor associated with the second MR bridge, and $\Delta MR$ is a magnetoresistance mismatch associated with the first MR bridge and the second MR bridge.

12. The method of claim 8, wherein:
   the sensor further includes a coil formed on a substrate, the coil having a first coil turn and a second coil turn that is disposed outside of the first coil turn,
   the first MR bridge includes a plurality of MR elements formed in a first region of the substrate and a second region of the substrate, the first region and the second region being located between the first coil turn and the second coil turn, and the first region and the second region being located on opposite sides of the first coil turn, and the second MR bridge includes a plurality of second MR elements formed in the first region of the substrate and the second region of the substrate.

13. The method of claim 8, wherein:

the sensor further includes a coil formed on a substrate;

the coil includes a first coil turn and a second coil turn that is disposed outside of the first coil turn, and the coil is coupled to a secondary loop that is formed inside the first coil turn;

the first MR bridge includes a first plurality of MR elements that are formed between the first coil turn and the second coil turn;

the second MR bridge includes a second plurality of MR elements that formed inside the first coil turn and inside the secondary loop.

14. The method of claim 13, wherein the second MR bridge is centered with the first coil turn.

15. A sensor, comprising:

a coil formed on a substrate, the coil having a first coil turn and a second coil turn, the second coil turn being formed outside of the first coil turn;

a secondary loop that is coupled to the coil, the secondary loop being formed inside the first coil turn;

a first MR bridge that is formed on the substrate, the first MR bridge including a first plurality of MR elements that are formed between the first coil turn and the second coil turn;

a second MR bridge that is formed on the substrate, the second MR bridge including a second plurality of MR elements that are formed inside the first coil turn and inside the secondary loop, wherein the second MR bridge is centered with the first coil turn.

16. The sensor of claim 15, wherein the coil and the secondary loop are defined by a same conductive trace.

17. The sensor of claim 15, wherein the first plurality of MR elements includes a first group of MR elements and a second group of MR elements, the first group of MR elements and the second group of MR elements being formed on opposite sides of the first coil turn.

18. The sensor of claim 15, further comprising a driver circuitry that is configured to supply a first voltage to the first MR bridge and a second voltage to the second MR bridge, wherein the second voltage is different from the first voltage, and supplying the first voltage and the second voltage to the first MR bridge and the second MR bridge, respectively, causes the first MR bridge and the second MR bridge to have matching stray field sensitivities.

19. The sensor of claim 18, wherein the second voltage is based on a magnetoresistance mismatch that is associated with the first MR bridge and the second MR bridge.

20. The sensor of claim 18, wherein the first voltage is determined according to an equation of:

$$VTMR_1 = -VTMR_2 \cdot q \cdot \frac{(1 - \Delta MR)}{(1 + \Delta MR)},$$

where $VTMR_1$ is the first voltage, $VTMR_2$ is the second voltage, q is a ratio between a first coupling factor associated with the first MR bridge and a second coupling factor associated with the second MR bridge, and $\Delta MR$ is a magnetoresistance mismatch associated with the first MR bridge and the second MR bridge.

* * * * *

UNITED STATES PATENT AND TRADEMARK OFFICE
CERTIFICATE OF CORRECTION

PATENT NO. : 11,262,422 B2
APPLICATION NO. : 16/870265
DATED : March 1, 2022
INVENTOR(S) : Hernán D. Romero et al.

It is certified that error appears in the above-identified patent and that said Letters Patent is hereby corrected as shown below:

In the Specification

Column 4, Line 38 delete "VMTRI" and replace with --VTMRI--.

Column 4, Line 40 delete "MR-elements" and replace with --MR elements--.

Column 4, Line 55 delete "VMTRZ" and replace with --VTMRZ--.

Column 4, Line 55 delete "element." and replace with --element 416.--.

Column 4, Line 57 delete "MR-elements" and replace with --MR elements--.

Column 4, Line 63 delete "402-408" and replace with --412-418--.

Column 6, Line 15 delete "210 exposed" and replace with --210 are exposed--.

Column 6, Line 65 delete "indicent" and replace with --incident--.

Column 7, Lines 7-8 delete "(L) and ΔMR" and replace with --(L) ΔMR--.

Column 7, Lines 56-57 delete "is driving" and replace with --is the driving--.

Column 9, Line 66 delete "VTRMZ" and replace with --VTMRZ--.

Column 10, Line 62 delete "VMTRZ" and replace with --VTMRZ--.

Column 17, Line 17 delete "that formed" and replace with --that are formed--.

Signed and Sealed this
Twenty-fifth Day of July, 2023

Katherine Kelly Vidal
*Director of the United States Patent and Trademark Office*